(12) United States Patent
Salter

(10) Patent No.: US 9,563,407 B2
(45) Date of Patent: Feb. 7, 2017

(54) COMPUTER IMPLEMENTED MODELING SYSTEM AND METHOD

(71) Applicant: Richard Salter, Oberlin, OH (US)

(72) Inventor: Richard Salter, Oberlin, OH (US)

( * ) Notice: Subject to any disclaimer, the term of this patent is extended or adjusted under 35 U.S.C. 154(b) by 0 days.

(21) Appl. No.: 14/613,257

(22) Filed: Feb. 3, 2015

(65) Prior Publication Data

US 2015/0220311 A1 Aug. 6, 2015

Related U.S. Application Data

(60) Provisional application No. 61/935,140, filed on Feb. 3, 2014.

(51) Int. Cl.
G06F 9/44 (2006.01)
G06F 17/50 (2006.01)

(52) U.S. Cl.
CPC ............. G06F 8/34 (2013.01); G06F 17/5009 (2013.01)

(58) Field of Classification Search
None
See application file for complete search history.

(56) References Cited

U.S. PATENT DOCUMENTS

| | | |
|---|---|---|
| 5,930,154 A | 7/1999 | Thalhammer-Reyero |
| 5,980,096 A | 11/1999 | Thalhammer-Reyero |
| 6,983,227 B1 | 1/2006 | Thalhammer-Reyero |
| 7,027,055 B2 | 4/2006 | Anderson et al. |
| 7,191,110 B1 | 3/2007 | Charbel et al. |
| 7,250,944 B2 | 7/2007 | Anderson et al. |
| 7,392,162 B1 | 6/2008 | Srinivasan et al. |
| 7,739,090 B2 | 6/2010 | Charbel et al. |
| 7,742,903 B2 * | 6/2010 | Ciolfi .................. G06F 17/5009 703/6 |
| 8,260,587 B2 * | 9/2012 | Sanchez .............. G06F 17/5009 703/2 |
| 8,621,422 B1 * | 12/2013 | Hsu ........................ G06F 3/0484 715/760 |
| 8,700,368 B1 | 4/2014 | Ciolfi et al. |
| 8,810,595 B2 | 8/2014 | Holm-Peterson et al. |
| 2002/0129333 A1 * | 9/2002 | Chandhoke ............... G06F 8/34 717/107 |

(Continued)

FOREIGN PATENT DOCUMENTS

| | | |
|---|---|---|
| AU | 2014100798 A4 | 8/2014 |
| WO | 0101206 A2 | 1/2001 |

OTHER PUBLICATIONS

Starfield, A. M., and R. M. Salter. "Thoughts on a general undergraduate modelling course and software to support it." Transactions of the Royal Society of South Africa 65.2 (2010): 116-121.*

(Continued)

*Primary Examiner* — Matthew Brophy
(74) *Attorney, Agent, or Firm* — Thompson Hine LLP

(57) ABSTRACT

A computer implemented modeling method and system that includes using a visual programming language to create a topological framework model configured to spatially arrange a set of one more agent submodels and incorporate an environmental submodel for each position of the topological framework model. The method further includes capturing the topological framework model by converting elements of the visual programming language into a textual programming language.

17 Claims, 29 Drawing Sheets

(56) References Cited

U.S. PATENT DOCUMENTS

| | | |
|---|---|---|
| 2004/0154003 A1* | 8/2004 | Oi ............................ G06F 8/36 |
| | | 717/135 |
| 2005/0141746 A1 | 6/2005 | Kobayashi et al. |
| 2006/0026560 A1* | 2/2006 | Kornerup .............. G06F 9/4881 |
| | | 717/113 |
| 2006/0235669 A1 | 10/2006 | Charbel et al. |
| 2008/0033897 A1* | 2/2008 | Lloyd ....................... G06F 8/34 |
| | | 706/19 |
| 2008/0092109 A1* | 4/2008 | Kinnucan ................. G06F 8/10 |
| | | 717/105 |
| 2008/0092111 A1* | 4/2008 | Kinnucan ................. G06F 8/10 |
| | | 717/105 |
| 2009/0089715 A1* | 4/2009 | Dickey ..................... G06F 8/34 |
| | | 715/853 |
| 2010/0153916 A1* | 6/2010 | Bhatkhande .............. G06F 8/34 |
| | | 717/120 |
| 2013/0060546 A1* | 3/2013 | Berenbach ................ G06F 8/10 |
| | | 703/6 |
| 2014/0184592 A1 | 7/2014 | Belcher |
| 2014/0237443 A1* | 8/2014 | Pana ........................ G06F 8/38 |
| | | 717/105 |
| 2014/0278294 A1 | 9/2014 | Yeager et al. |
| 2014/0343916 A1 | 11/2014 | Rai et al. |

OTHER PUBLICATIONS

Brazin et al., Using System Dynamics in Modeling Production Systems, International Conference on Operations Research and Statistics (ORS), Proceedings: pp. 180-184. Singapore: Global Science and Technology Forum (2011).

* cited by examiner

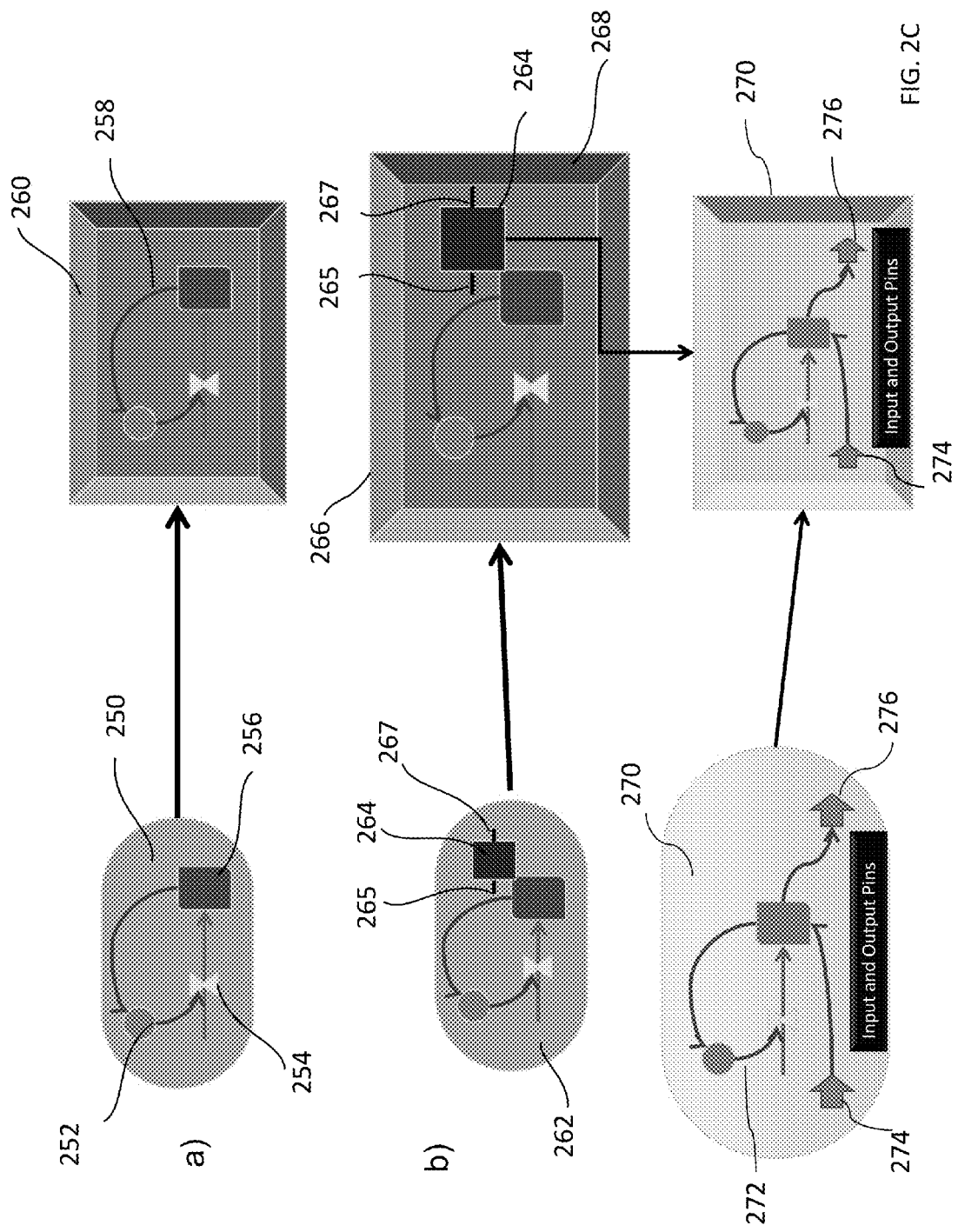

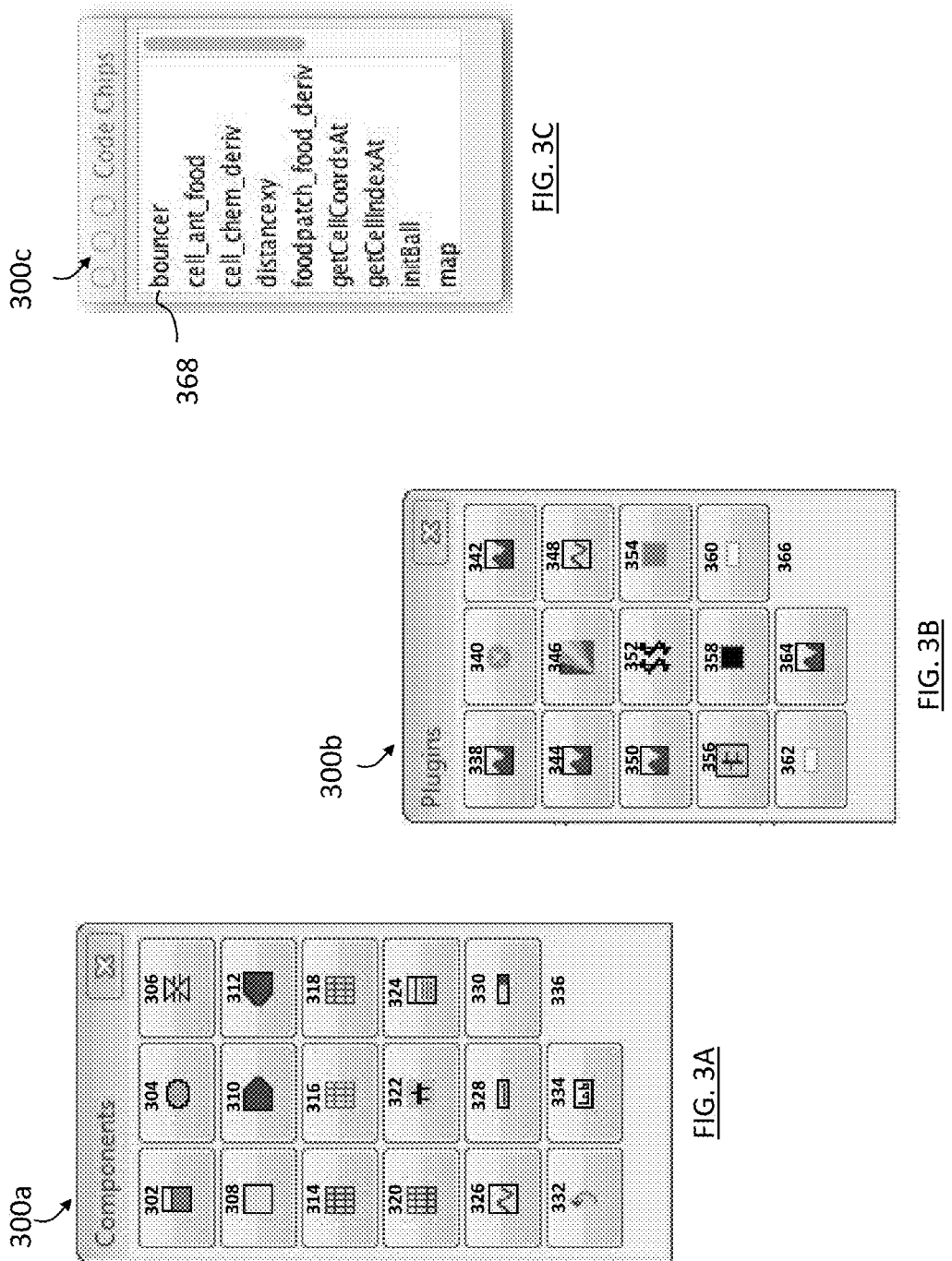

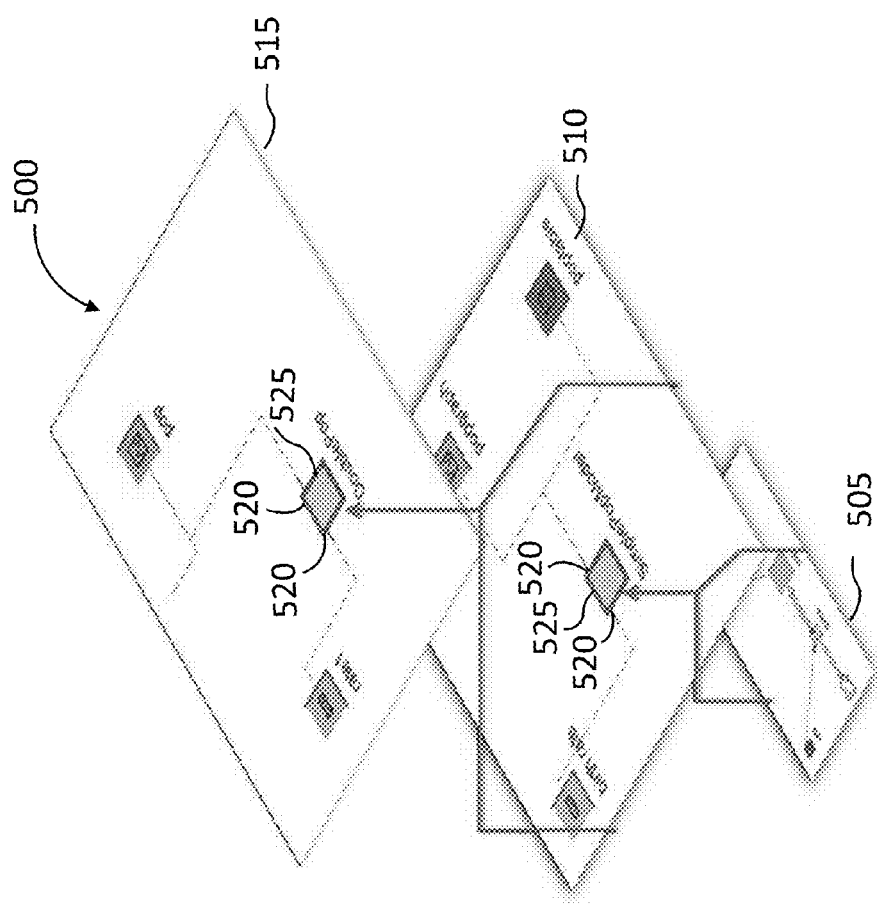

COMPUTER IMPLEMENTED MODELING SYSTEM AND METHOD

CROSS-REFERENCE TO RELATED APPLICATIONS

This application claims priority to U.S. Provisional Patent Application No. 61/935,140, entitled COMPUTATIONAL MODELING SYSTEM AND METHOD, filed Feb. 3, 2014, which is incorporated by reference in its entirety.

STATEMENT REGARDING FEDERALLY SPONSORED RESEARCH OR DEVELOPMENT

This invention was made with government support under grant CNS-0930153: CPATH-2: Teaching Computational Thinking through Integration of Dynamic Systems Modeling awarded by the National Science Foundation. The government has certain rights in the invention.

TECHNICAL FIELD

The systems and methods relate generally to a computer implemented modeling system and methods of using the system and more particularly a computer implemented system and method for modeling systems where the models include system dynamics, topological modeling, or agent-based modeling or some combination of the three.

SUMMARY

In one aspect, a computer implemented modeling method is disclosed that includes creating, using a visual programming language, a topological framework model configured to both spatially arrange a set of one or more agent sub-models and incorporate an environmental sub-model for each position of the topological framework model. The method also includes creating, using the visual programming language, a set of one or more agent sub-models, each of which is configured to mimic behavior of a previously identified real world object and creating, using the visual programming language, a set of environmental sub-models, each of which is configured to simulate an environment associated with an identified position of the topological framework model. The method also includes populating, using the visual programming language, each position of the topological framework model with a member of the set of environmental sub-models, and populating, using the visual programming language, the topological framework model with each member of the set of agent sub-models. Further, the method includes capturing the topological framework model by converting elements of the visual programming language to a textual programming language to create an execution script, beginning execution of the topological framework model according to the execution script, tracking incremental steps of execution of each member of the set of agent sub-models according to a clock configured to synchronize execution of each member of the set of agent sub-models, and displaying, in a graphical user interface, a visual representation of the topological framework model associated with a specific clock tick, wherein an environmental sub-model at the identified position of the topological framework model is configured to influence behavior of an agent sub-model at the identified position of the topological framework model by either constraining or enabling a behavior of the agent sub-model and the agent sub-model at the identified position of the topological framework model is configured to alter a parameter of the environmental sub-model at the identified position of the topological framework model.

BRIEF DESCRIPTION OF THE DRAWINGS

FIGS. 2C-2D are system block diagrams illustrating exemplary components and illustrative models made using the computer implemented modeling system described.

FIGS. 3A-3C are views of exemplary graphical user interfaces included in computer implemented modeling systems discussed in this document.

FIG. 5A is an illustration of a schematic illustrating the multi-level design capability of computer implemented modeling systems discussed in this document.

DETAILED DESCRIPTION

The following detailed description is illustrative in nature and is not intended to limit the examples of the systems and methods in this document or the application and uses of such examples. Furthermore, there is no intention to be bound by any expressed or implied theory presented in the preceding technical field, background, brief description of the drawings, or the following detailed description.

Examples of the systems and methods in this document provide a multipurpose/multiplatform computer implemented modeling system and method for modeling systems that may include of system dynamics, spatial or topological space modeling (for example, cellular automata, directed graph networks), or agent-based modeling (or any combination of the three). The computer implemented modeling system illustrates, graphically depicts states for example, a representation (mathematical and/or pictorial) of at least a part of a system over a time period, for example, some part of reality (an abstracted real world item) including systems with applications in, but not limited to, biology, economics, chemistry, mathematics, physics, engineering, medicine, psychology, agriculture, sociology, political science, and other fields.

Figure 1:
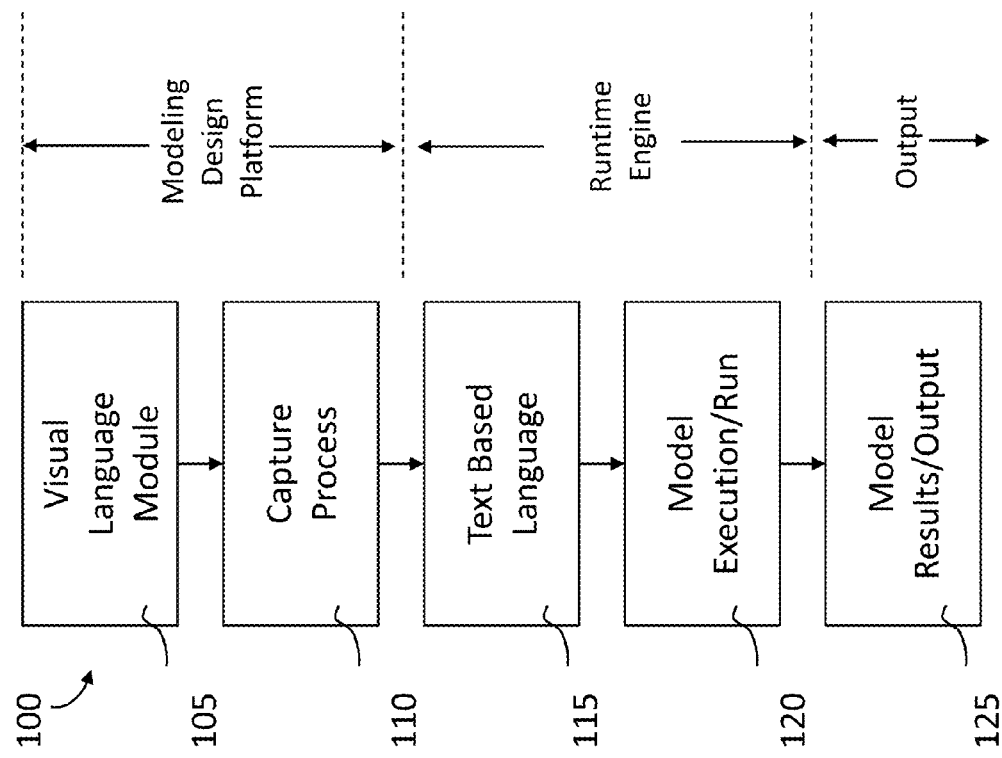
FIG. 1 is a flow diagram illustrating a modeling method.

FIG. 1 is a flow diagram illustrating a modeling method 100. An exemplary computer implemented modeling method 100 can use a system that can include a modeling design platform, a runtime or simulation engine, and model output or results. A user of computer implemented modeling system using a method can create a model of a quantitative representation of at least part of a system using a computer software program having a visual language module at 105 including at least one of the following examples: system dynamics modeling, spatial or topological space modeling (cellular automata, directed graph networks), and agent-based modeling, as further described in this document. System dynamics models represent interactions of a number of components that change over time. Spatial models add the dimension of topological space or framework and in some examples add interaction between neighboring elements. Agent-based models include encapsulated systems that optionally have a spatial dimension and move within space and interact with other models (encapsulated systems) and their systems/environments.

In the illustrated example, the user or computer system can initiate a capture process or capture function at 110 that can convert the visual language used to create a model into an executable or interpretable text-based language at 115. For example, capturing converts elements of the visual programming language to a textual programming language to create an execution script. The text-based language can be, for example, a high level programming language such as JavaScript or a modified form of JavaScript such as the version of JavaScript supported by the Rhino® JavaScript engine, version 1.7R4 (Jun. 18, 2012—available from the Mozilla Foundation). Further, the high level programming language can include software objects that can correspond to each of the components in the visual programming language. The software that can run the models described can include an interpreter program. During simulation of the model, execution of the model can use an interpreter. In another example, additional or alternative suitable programming languages can be used in the computer implemented modeling system.

Once the visual language module is converted into a runnable script at 115 using the capture process, the model can be executed at 120 to produce model results or output at 125. Beginning execution of the topological framework model can be done according to the execution script. In another example, the runnable script can be deployed over a network or the like. In another example, the runnable script can be optionally edited or modified before the model is executed. In yet another example, the user of the computer implemented modeling system specifies the model using the textual high level programming language and reverses the capture process or "uncaptures" the script language to convert the script language or a portion thereof into a visual language module.

The graphical components in the graphical language can be entities with defined functionality. Each component is named (except for arrows) and all component names within a capsule are unique. All components that make a model are included in a capsule. Components can be connected by using arrows drawn between components or by using connections between pins for components that have pins, that is, chips, plug-ins, and aggregators. A component in the graphical model has a corresponding component, for example, a textual high level programming language object, of which there is one corresponding textual high level programming language object for each graphical component type. The textual high level programming language object is produced during the capture process. The corresponding software component is called a capsule of the corresponding graphical component and is constructed according to a textual description called a schema.

Graphical components include a plurality of types, including atomic components, display and control components, capsules, containers, plug-ins, and code chips. Atomic components have a singular function in the model design and include stocks, sequences, local variables, flows, terms, commands, data input, data output, and arrows (see further descriptions below in reference to FIG. 3A). Display and control components include graphs and tables for displaying data and sliders and spinners for inputting parameters into model components. Capsules can be models or portions of a model using atomic components, display and control components, container components, plug-in components, and code chip components.

Figure 2A:
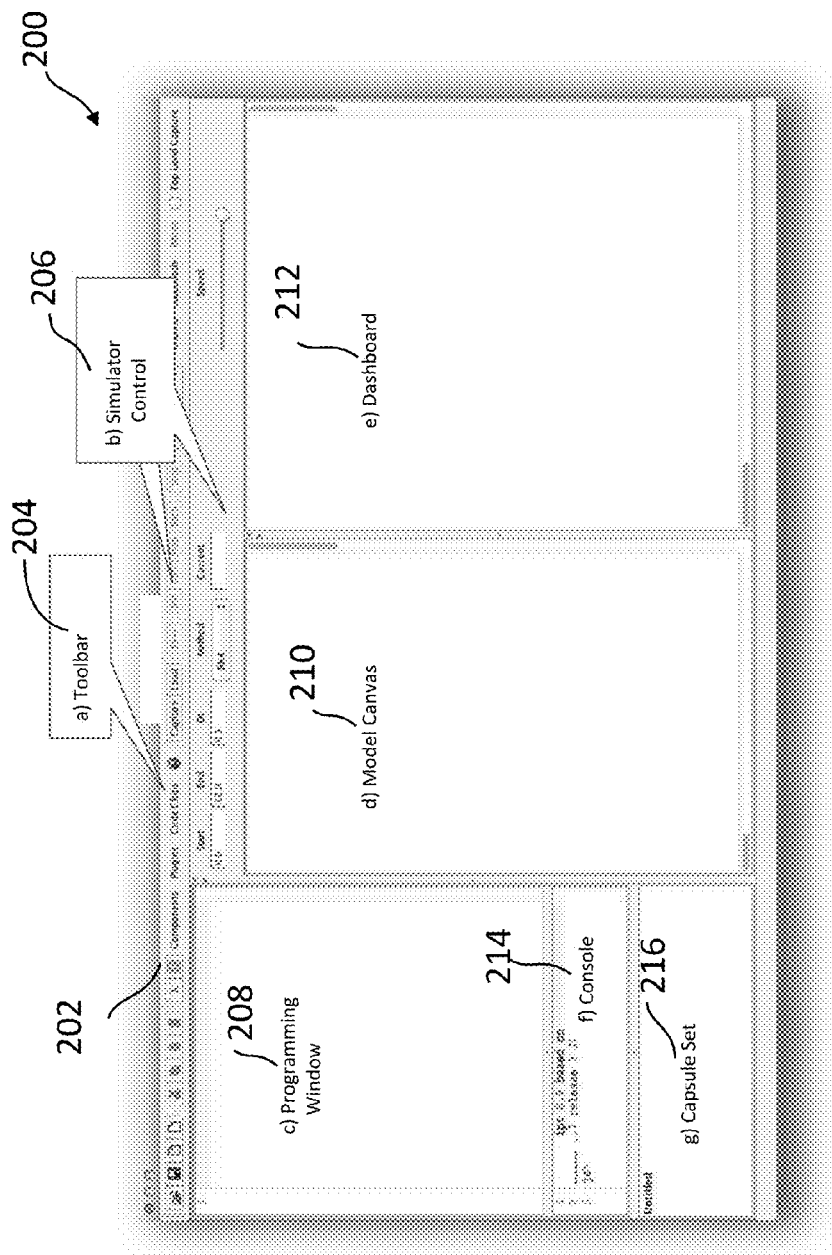
FIG. 2A is a view of a graphical user interface of a computer implemented modeling system described.
Figure 2B:
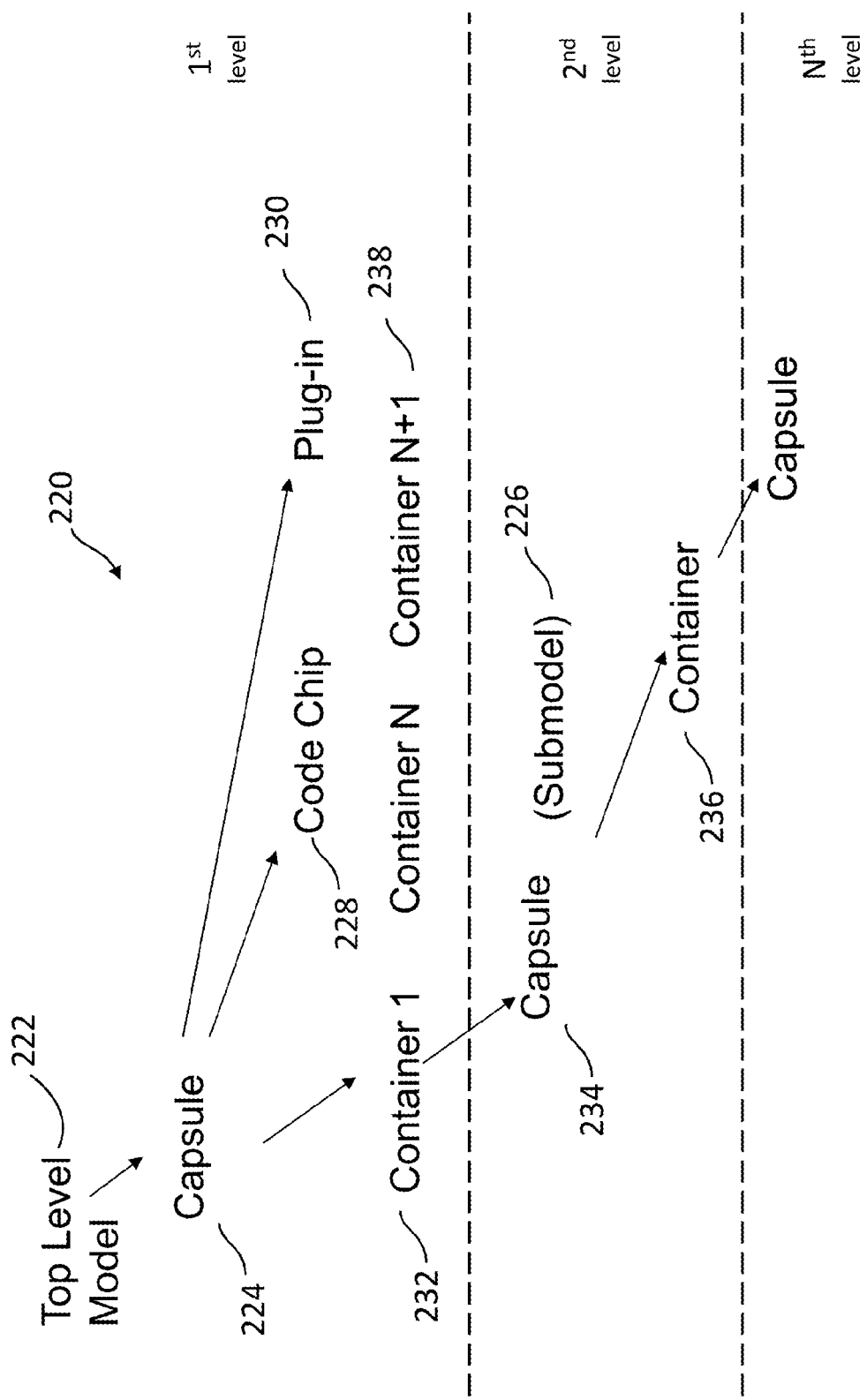
FIG. 2B is an illustration of a schematic illustrating components and model levels of the computer implemented modeling system described.

As further discussed below and as illustrated in FIG. 2B, containers can be components encapsulating one or more capsules by using functionality that refers the container to the capsule. This is also referred to as embedding a capsule into a container or referred to as populating positions of a modeling framework, populating each member of a set of agents, or the like.

Two container types, include but are not limited to, chips and clocked chips. A chip contains a single capsule for use as a submodel within the model containing the chip (the model one level above the submodel). The capsule contained in the chip uses input and output components (for example, data inputs and data outputs) to communicate with the parent model/level. An input/output component can be a pin on the chip that can be connected to a parent model component, for example an input pin. A clocked chip is similar to the chip previously described but further can include a simulation clock for dividing the simulation interval of the containing model.

Components can further include computer instructions that define the behavior of the component and its relationship to other components. These computer instructions include textual high level programming language expressions. In another example, the computer instructions include other computer language expressions. The component computer instructions can include primitive operators that can be textual high level programming language procedures and properties or constants. The primitive operators and properties that can be sufficient to support system dynamics can be provided universally in the modeling software, including but not limited to mathematical operations and random number generation.

Additionally, software services can be available for components that have or depend on the component's environment. The component environment is the environment of the capsule containing the component, either the top level or some other level (container) of which the capsule is a part. These primitive operators and properties can be available to components in a capsule when the capsule is contained in a container having the primitive operators and properties. These establish the topological structure of the component in the container (an aggregator for example) and facilitate communication among elements of the component in the container.

FIG. 2A is a view of a graphical user interface of a computer implemented modeling system described. The exemplary computer implemented modeling system 200 can include a user interface 202. In the illustrated example, computer implemented modeling system 200 can include a design platform and a runtime engine (discussed in this document) where the design platform is displayed as user interface 202 and can include a toolbar 204, a simulator control 206, a programming window 208, a modeling canvas 210, a dashboard 212, a console 214, and a capsule set 216. A display can produce a visual representation of a modeling framework, for example, a topological framework, according to a specific model clock timer, tick, or the like.

In the illustrated example, toolbar 204 can include a plurality of user input buttons, including but not limited to: open model, save model, new main model, new submodel, and software functions, including but not limited to cut, copy, paste, and delete. Further, toolbar 204 can include graphical buttons that a user can manipulate to gain access to a textual high level programming user interface, components, plug-ins, and code chips (all to be discussed further in this document). In the illustrated example, simulator control 206 can include functions or controls to operate the model simulator, including functions to capture, load, and execute the model and also include functions to do one of the following: initiate, run, step, back (controls execution of the simulation), stats/no stats (controls optional interaction with the R statistical language), timeline (reveals a slider that facilitates forward and backward motion through the simulation), automode (initiates a mode of operation whereby any input change automatically reruns the simulation), Imode (initiates a mode of operation whereby intermediate computations can be revealed on the visual model), and top level capture (forces capture to occur only at the top level). Further, the simulator control can include clock settings, including start and end time, time step or Δt, integration method, and current speed. For example, the simulator can track incremental steps of execution of each member of the set of agent sub-models according to a clock configured to synchronize execution of each member of the set of agent sub-models. These settings can be adjusted by the user and/or programmed in modeling components of the computer implemented modeling system 200.

In the illustrated example, programming window 208 is a user interface where a user enters functions and scripts supported by textual high level programming language, enabling a user to design sophisticated models incorporating auxiliary functions and constants. Modeling canvas 210 is a user interface where a user can create and design a model, submodel, and/or a capsule as described further in this document using a graphical modeling environment where graphical modeling objects/components can be added to the modeling canvas 210 from the components, plug-ins, and code chips areas of the tool bar using a mouse or some other user input (touchscreen, keyboard, and the like). These graphical modeling objects can be connected and programmed to simulate at least part of a system as further discussed in this document.

The computer implemented modeling system can include a very powerful visual programming language that is independently codeable and expressive. The modeling canvas can be used to visually create the capsules. The structure of the models and capsules can be expressed with the visual icons on the same level and at different levels in a way that is not possible with textual computer code. In addition, the visual language of the computer implemented modeling system can be built by the user by using a drag and drop feature within the visual language, for example, a user can drag and drop a capsule type from the capsule set 216 onto a container in the model canvas 210, embedding the capsule in at least one component in the container. The drag and drop feature is a physical gesture example of the computer implemented modeling system that increases speed and efficiency of the system.

Further in the illustrated example, dashboard 212 is a user interface where inputs and outputs or results of the model simulation, including graphs, charts, sliders, spinners, and the like, can be displayed and accessible to a user. In another example, graphical controls like sliders, spinners, and/or dials can be added to the model on model canvas 210 and displayed on dashboard 212, allowing the user to design and execute model variations quickly.

Console 214 is where a user can enter an individual textual high level programming language command or prompt, that is, console 214 is an interactive shell for communication with the runtime engine. For example, instead of using a visual language to create a model on the modeling canvas, a user of the system can specify directly in console 214 (or the code frame) using the textual language textual high level programming language. Further, a user can interact with an executing simulation through console 214 to determine its state, for example, running, complete, values of program variables, and the like.

Capsule set 216 is a list that provides the user access to saved lower level models, submodels, or capsules. These can be used to connect submodels or nested models to any higher level model by means of input and output channels/pins as described in this document, for example, embedding a capsule in a container. A higher level model is a model that incorporates one or more capsules selected from capsule set 216. Such a model would be a parent model to the submodels it contains. A lower model is a capsule selected from capsule set 216 and added to a higher level model.

FIG. 2B is an illustration of a schematic illustrating components and model levels of the computer implemented modeling system described. The exemplary modeling system structure can be used to create a model 220 using the modeling systems and methods described in this document. Model 220 is a representation of a model using visual and/or textual language(s) for the purpose of running a simulation of a real world event. Models can be stored in files in an XML (extensible markup language) based format. In other examples, models can be only in a textual language.

A model 220 can include a set of components including a top level model 222 that can include at least one lower level submodel 226, that is, each submodel 226 is another layer or sublayer of the model. In this example, a top level model 222 having a capsule 224 is shown in a first level of the model 220. A capsule is a software module that is part of the architecture or design of a model. The software module can include atomic components, display and control components, containers, plug-ins, and/or code chips. Every model has at least a single capsule in the first level of the model that defines the model (there can only be one model defining capsule). Other capsules in the model must be part of some container and constitute a submodel. As further described, the top level model 222 and the capsule 224 can be included in a first portion of a visual model.

Each capsule in model 220 comes from (is instantiated from) a capsule prototype. A capsule prototype can be used to instantiate any number of capsules, except for the top level model capsule (only one exists). A capsule prototype is a set of interconnected components, including atomic components, displays, controls, containers, plug-ins, and code chips. These components describe at least a part of model 220. Capsule prototypes can be created using the visual and or textual computer language(s) described in this document.

Also illustrated in FIG. 2B can be a code chip 228 and a plug-in 230. In this example, code chip 228 and/or plug-in 230 can be added to capsule 224 in the top level of the model. The code chips 228 and the plug-ins 230 do not create an interface or portal to another sublevel in the model, that is, they are not containers. Any number of code chips and plug-ins can be added to any level.

A code chip is a component whose function is defined using script text, for example, a textual high level programming language, Java, or some other type of script language used by one skilled in the art. Inputs and outputs to graphical code chips can be through input and output pins that can be connected to another component on the same level. Each named code chip identifies a class of code chips all containing the same script text, input(s) and output(s). In one example, multiple instances of a code chip class appear with different input and output connections. Exemplary types of code chips include the following: purely functional code chips, object code chips, and functional output code chips. Purely functional code chips have outputs that can be computed using only values from inputs. Object code chips include one or more fields (also called static variable field (s)) that can be initialized at the beginning of the simulation and hold their assigned value between iterations. These state values can be used in conjunction with inputs to compute the outputs. Functional output code chips include one or more outputs defined to be a procedure which is invoked in the target component. Functional output code chips can be either purely functional or object types. Code chips can be exported and saved as files in an XML-based format and imported into other models.

A plug-in is a component performing a function, such as visualization and control. Plug-ins can be written as computer programs (for example, Java programs) using a Plug-in API (application programming interface) and can be added to any instance of software, for example software on a desktop and the like. Plug-in API is a set of Java program objects that serve as a base of classes for the classes used in writing a plug-in. For example, plug-ins can be represented in JavaScript or the textual high level programming language using a single class that is specialized for a plug-in type.

If a submodel is needed in the model, at least one container 232 is added to capsule 224 in the first (parent) level of the model or added to another capsule in a lower level model. In this illustrated example, the container 232 is included in the first portion of the visual model and can include an interface, for example, input and output pins (not shown). The input pin of the interface connects to another capsule 234 in a lower level of the model. Generally, a submodel can be created by including a container in a first level and then connecting a capsule from a lower level to the container in the first level. A submodel can include its own container and thereby be a parent of another submodel. For example, the capsule in the lower level can include a second portion of the visual model. Once created, submodels can be exported to their own XML (extensible markup language) based files and reused in other models. For example, a model may include a topological framework model configured to both spatially arrange a set of one or more agent sub-models and incorporate an environmental sub-model for each position of the topological framework model. The submodels may include a set of one or more agent submodels configured to mimic behavior of the agent or a set of environmental submodels configured to simulate the environment of a position in the environmental framework.

A container is a component referencing one or more capsules. A container is one of the following: a chip, a clocked chip, or an aggregator. A container can be thought of as a door from a higher level to a lower level (and vis-versa).

A chip contains a single capsule for use as a submodel within the model containing the chip. The capsule uses data input and/or data output components to communicate with an interface of the chip. Further, the chip can include data input and data output components (pins) that connect to a component having an interface in a parent level portion of the model.

A clock chip is a chip (as described above) in combination with a simulation clock for subdividing the simulation interval of the model/submodel.

As discussed above, a container can include an aggregator. An aggregator can include components containing one or more capsules organized with regard to geometric and topological designs or topological frameworks. For example, an aggregator can include any of the following types of aggregators: agent vector, cell matrix, sim world, node network, and net world (as further described below and illustrated in the figures).

If a second submodel (or Nth submodel) is needed in the model, at least one container 236 can be added to capsule 234 in the second (1st child) level of the model, added to another capsule in a lower level model, and/or added to another container in the first level of the model (that is, container N or container N+1).

As illustrated in FIG. 2B, more than one submodel can be added to any level by adding a plurality of containers 238 to a single level of the model. Each container contains a capsule and each capsule can include or does not include another container (another submodel).

FIG. 2C is a system block diagram illustrating exemplary components and illustrative models made using the computer implemented modeling system described. Capsule prototypes can be made using a visual programming language. Capsule prototype 250 can include interconnected stock 252, flow 254, and term 256 that can be software modules. Once the capsule prototype is created in the modeling system and saved as a unique capsule prototype name, capsule prototype 250 can be used in the modeling system by adding a capsule 258 to a model 260. Once added to a model, the capsule can be modified by adjusting the parameters of the specific capsule. In another example, the capsule prototype and capsule can include a textual computer language or both graphical and textual computer languages. Also illustrated in FIG. 2C is a capsule prototype 262 that is substantially the same as capsule prototype 250 discussed above, except capsule prototype 262 can include a container 264 having input pin 265 and output pin 267. The container 264 having input pin 265 and output pin 267 allows data to be passed between the container and another component within the model. As described further below, a container can be one of the following: a chip, a clocked chip, and an aggregator. Further in the illustrated example, the capsule prototype 262 having the container 264 having input pin 265 and output pin 267 is added to a model 266 as a capsule 268. For a model with multiple levels, another capsule is required. In the illustrated example, capsule prototype 270 can include interconnected components 272 with input pin 274 and output pin 276. Although not illustrated, the container 264 having input pin 265 and output pin 267 from model 266 represents the input/output interface of sub-model 270 through the correspondence of input pin 265 with input pin 274, and output pin 267 with output pin 276. If a component in the model 266 is connected to container input pin 265, its value will be retrievable from sub-model input pin 274. If a component is connected to container output pin 267, that component will retrieve the value of sub-model output pin 267.

Figure 2D:
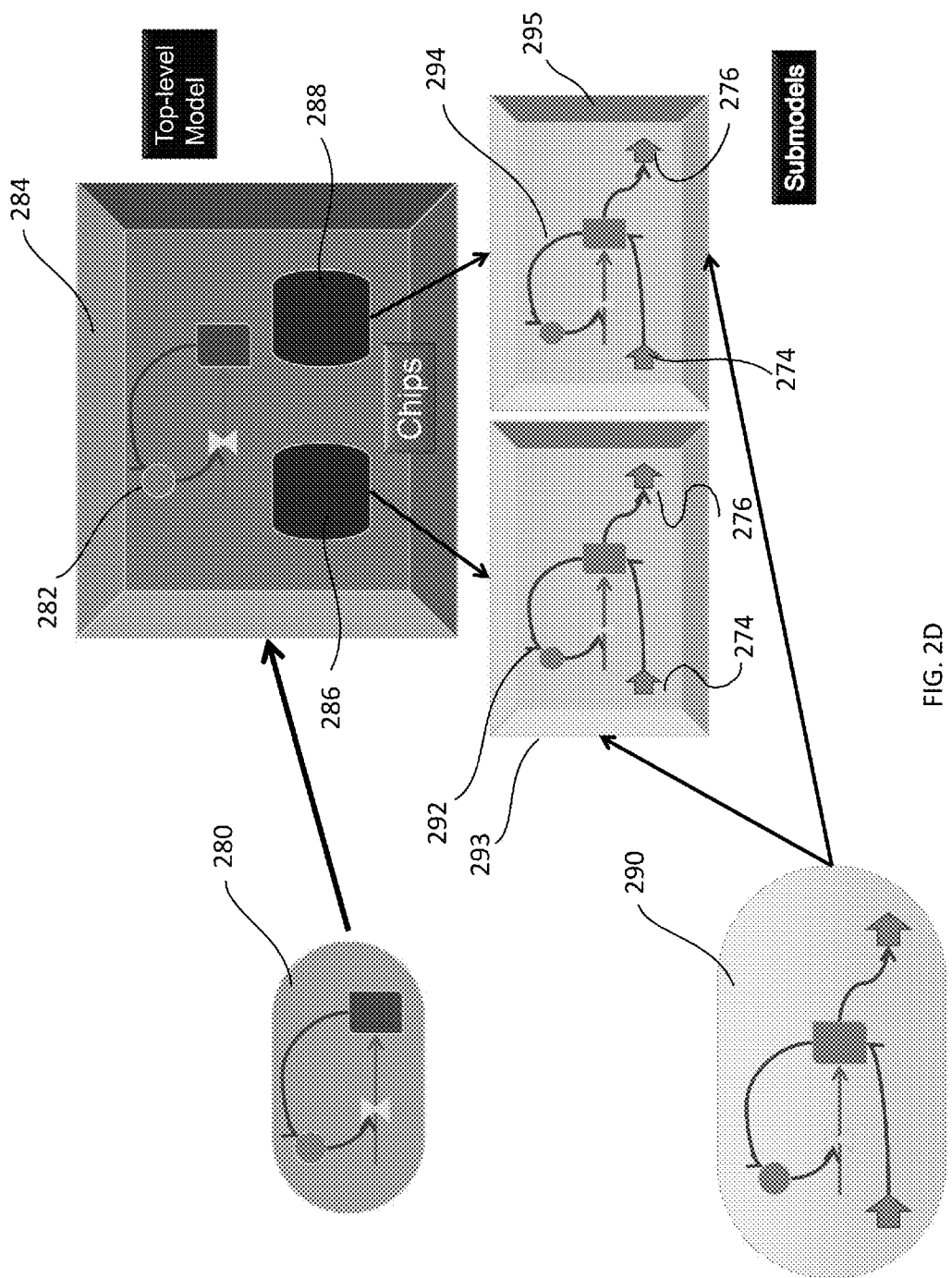

FIG. 2D is a system block diagram illustrating exemplary components and illustrative models made using the computer implemented modeling system described, for example, a model having capsules and a top level model and two submodels. In the example, first capsule prototype 280 can be used to create a first capsule 282 in top level model 284. Model 284 can include a first chip 286 and a second chip 288, each having input pins and output pins (not shown). A second capsule prototype 290 can be used to create a second capsule 292 in submodel 293 and a third capsule 294 in submodel 295. Input and output pins in first chip 286 correspond respectively to input and output pins in submodel 293. Further, input and output pins in second chip 286 correspond respectively to input and output pins in submodel 295. The input and output pins of the chips can be connected to components in top level model 284, causing values to be shared between components of the parent and the child, as described in the previous paragraph. The capsules in the sub-models can be the same or different depending on how the parameters of the specific capsule can be set/adjusted.

FIGS. 3A-3C are views of exemplary graphical user interfaces included in computer implemented modeling systems discussed. For example, the graphical user interfaces ("GUI) included in computer implemented modeling system 200 in FIG. 2 that a user selects in toolbar 204 to build a model on the modeling canvas 210. The illustrated example can include components GUI 300a, plug-ins GUI 300b, and code chips GUI 300c. The components in GUI 300a are the building blocks of the graphical or visual modeling environment that can include a plurality of the following buttons/icons: add stock 302, add term 304, add flow 306, add command 308, add data input 310, add data output 312, add cell matrix 314, add node network 316, add agent vector 318, add sim world 320, add code chip 322, add table 324, add graph 326, add slider 328, add spinner 330, arrow 332, and add label 334. In another example, components GUI 300a can include additional components represented by additional component 336 or do not include all the components in the illustrated example. For example, sequences include functionality that determine a subsequent value.

Add stock 302 component adds a stock to the model. Stock is a reservoir or bucket for the values managed by a model. Items can move into or out of a stock through flows that can be connected to it. The value of a stock at the end of each time step is equal to the value at the previous time step, plus any inflows, minus any flows going out. Stocks that are not connected to flow objects will not change. A sequence is a type of stock that is set up to operate according to a discrete time model (as opposed to continuous time). Each stock can be defined (using a right mouse input, etc. that opens a GUI) by at least one of the following properties: initial value (required), history, interactive graph, non-negative, and discrete. A stock that is indicated as discrete operates according to a discrete time model and becomes known as a sequence. A stock can be connected to at least one of the following: a flow, a display, a term, and a control.

Add term 304 component adds a term to the model. A term is a visual placeholder for an expression, typically holding a parameter value or computes an algebraic expression based on other objects, either for display or to feed into another part of the model. A term that has a value that does not change over the course of the execution of the model is called a property. Each term can be defined (using a right mouse input, etc. that opens a GUI) by at least one of the following properties: value (constant, equation, model objects, or functions), graphical term, property, precision, batch process, start, end, and increment. A term can be connected to at least one of the following: a flow, a stock, other terms, controls, and displays.

Add flow 306 component adds a flow to the model. Flow is analogous to a pipe or conduit that moves material into or out of a stock. At least one flow needs to be connected to a stock and the flow can have a supply of material (for example) that is finite or infinite. Each flow can be defined (using a right mouse input, etc. that opens a GUI) by at least one of the following properties: value (constant, equation, model objects, or functions) and uniflow (one direction flow) or biflow (either direction flow).

Add command 308 adds an object to the model that contains an expression that is executed each time step. Commands can hold large amounts of computer code.

Add data input 310 adds an input to a model, submodel, program or the like. Similarly, add data output 312 adds an output to a model, submodel, program or the like. Data inputs/outputs provide connections from a submodel to its containing super model or aggregator.

Add cell matrix 314 adds a cell matrix to a model. As discussed below, a cell matrix is a type of aggregator provided in computer implemented modeling system 200 that provides a multi-dimensional (two-dimensional for example) array of cells, with each grid cell populated by a capsule or a submodel. Cell Matrices provide a means for spatially explicit models including cellular automata models, spatially arranging agents and the like. Further, a cell matrix can be a grid or special landscape (a topological framework) in which each one by one (1×1) cell is an agent, that is, an independently running model or capsule. In another example, a (1×1×1) space is an agent. The dimensional grid or special landscape can be of any configuration, including for example (but not limited to) Cartesian topology or tessellated hexagons. Each cell matrix provides each component with access to parameter values of every other element of the matrix. In one example, all agents can be duplicates but independent copies of a submodel, for example, a capsule as discussed in this document, where the independent copies of the submodel may have the same, similar, or different functionality. Each cell matrix can be defined (using a right mouse input, etc. that opens a GUI) by at least one of the following properties: rows, cells, spotlight row, spotlight column, inputs, outputs, inputs from submodels and one output connected to a component of the model, for example, a raster plug-in that displays the cells of the cell matrix. For example, computer implemented modeling system 200 can include a model library that can include the "Game of Life" model that can include a cell matrix connected to a Raster display (see FIGS. 8A-8B discussed below). In another example, the cell matrix is a three dimensional grid. In the computer implemented model system, a user who wants to create a cell matrix can drag and drop a capsule representing the cell type from the capsule set 216 onto the cell matrix container in the model canvas 210. Game of Life is a model described below and illustrated in FIGS. 8A-8B that illustrate a model having a cell matrix where model simulation can include spatial topology simulation of a real world event.

A cell matrix 314 can also include additional primitive operators and properties, also known as software services or functionality. Software services of a cell matrix can include the following: identifying the cell matrix's coordinates, list of all cells within "n" units from the caller, list of all cells exactly "n" units from the caller, provides access to component values of the cell at a matrix address (for example, a row and column location), and communication between neighboring cells. Further, another service a cell matrix can include is the functionality of consulting neighboring cells to retrieve state values for use in the agents own computations. This functionality can also be referred to as neighbor awareness functionality.

Add cell network 316 adds a cell network to a model. A cell network is also referred to as a node network. As discussed below, a cell network is another type of aggregator (a container) provided in computer implemented modeling system 200. Cell network constituents can be modeled as capsules that can be the nodes of a weighted network, that is, directed graph or directed mathematical graph, whose topology (for example, a topological framework model) is implemented in the model and determined programmatically. The cell network provides connectivity information to each node. In the computer implemented model system, a user who wants to create a node network (a cell network) can drag and drop a capsule representing the node type from the capsule set 216 onto the cell network container in the model canvas 210. Network SIR is a model described below and illustrated in FIG. 9A that illustrates a model having a cell network.

A cell network or node network 316 can also include additional primitive operators and properties, also known as software services or functionality. Some of the software services a cell network or node network can include the following: a unique number labeling each node/cell, number of nodes/cells, the set of inbound connections or set of inbound arcs connected to the node/cell, the set of outbound connections or set of outbound arcs connected to the node/cell, access to component values in the node/cell labeled by the unique number label, an array of nodes, and communication between neighboring nodes. Further, another service a cell network or node network can include is the functionality of consulting neighboring cells/nodes to retrieve state values for use in the agents own computations.

Add agent vector 318 adds an agent vector to a model. As discussed, an agent vector is yet another type of aggregator provided in computer implemented modeling system 200. An agent vector is a one dimensional vector of capsules each of which is called an agent. An agent vector is an agent container that is not itself spatially organized; therefore, each agent operates independently. Further, each agent can include a pair of coordinates describing the agent's position within a two dimension Cartesian space that can change over time. In other words, each agent vector organizes its constituents as a vector, enhancing the component capsule (model) with x-y location functionality. Agent vectors can be considered dynamic because their components/constituents/elements can come and go, for example, to and from a cell. Therefore, each agent vector is able to perform like an agent in an agent-based model. Furthermore, agent vectors facilitate information exchange among the agents. An agent vector connects to the agent viewer plug-in. In the computer implemented model system, a user who wants to create an agent vector can drag and drop a capsule representing the agent type from the capsule set 216 having a capsule onto the agent vector container in the model canvas 210. Flock is a model described below and illustrated in FIG. 10A that illustrates a model having an agent vector.

Agent vectors 318 can also include additional primitive operators and properties, also known as software services. Some of the software services an agent vector can include can be the following: unique number labeling for each agent, the dimensions of space (for example, multi-dimensional like column and row) occupied by the agent, length of time agent has existed, access to component values in the agent labeled by the unique number, list of current agents, list of agents located at a specific coordinate(s), total number of agents, list of unique numbers for current agents, scheduling for creation of new agents, scheduling for deletion of existing agents, coordinate location and movement of agent (s), and agent communication Add sim world 320 adds a sim world to a model. As discussed, a sim world is another type of aggregator (a container) provided in computer implemented modeling system 200. A sim world combines one agent vector with one cell matrix to implement a topological space combining the two. In other words, a sim world combines a cell matrix and an agent vector into a single simulation space, with the cell matrix serving as the space in which the agents of the agent vector exist. For example, in this space each agent vector agent's position (multi-dimensional position, for example, a two dimensional position) places it within the Cartesian space created by regarding the cell matrix coordinates as lattice points of a plane, and each cell matrix cell as a 1×1 tile of that plane. In another example, the agent's position is in a three-dimensional space. A model having a sim world is capable of having information exchanged between cells and agents, such information modifies the state of the cell and/or the location of the agents. In the computer implemented model system, a user who wants to create a sim world can drag and drop a capsule representing the agent and cell type from the capsule set 216 onto the sim world container in the model canvas 210. Antz is a model described below and illustrated in FIG. 11A that illustrates a model having a sim world.

A sim world 320 can also include additional primitive operators and properties, also known as software services or functionality. Some of the software services a sim world can include are the following: unique number labeling for each agent, the dimensions of space (for example, multi-dimensions like column and row) occupied by the agent, length of time agent has existed, access to component values in the agent labeled by the unique number, list of current agents, list of agents located at a specific coordinate(s), total number of agents, list of unique numbers for current agents, scheduling for creation of new agents, scheduling for deletion of existing agents, coordinate location of agent(s), setting coordinates of the caller, cells are able to detect agent occupants, agents can identify the cell (space) they occupy, and can identify the number of agents currently occupying a specific cell (space). Additional software services a sim world can include are the following: identifying the cell matrix's coordinates, list of all cells within "n" units from the caller, list of all cells exactly "n" units from the caller, and provides access to component values of the cell at a matrix address (for example, a row and column location).

Another exemplary aggregator is a net world. A net world combines an agent vector with one node network that implements a topological space in which each agent has a position attribute assigning it to a node/cell of the node network. Agents can move between connected nodes. A net world can also include additional primitive operators and properties, also known as software services. Some of the software services a net world can include are the following: unique number labeling for each agent, the dimensions of space (for example, multi-dimensional dimension like column and row) occupied by the agent, length of time agent has existed, access to component values in the agent labeled by the unique number, list of current agents, list of agents located at a specific coordinate(s), total number of agents, list of unique numbers for current agents, scheduling for creation of new agents, scheduling for deletion of existing agents, coordinate location of agent(s), setting coordinates of the caller, a unique number labeling each node/cell, number of nodes/cells, set of inbound connections or set of inbound arcs connected to the node/cell, set of outbound connections or set of outbound arcs connected to the node/cell, access to component values in the node/cell labeled by the unique number label, and an array of nodes. Additional software services a net world can include are the following: returns to a node the list of agents currently occupying a cell/space, identifying the number of agents occupying a cell/space, identifies an agent's node location, and moving an agent caller to a node.

Figure 7:
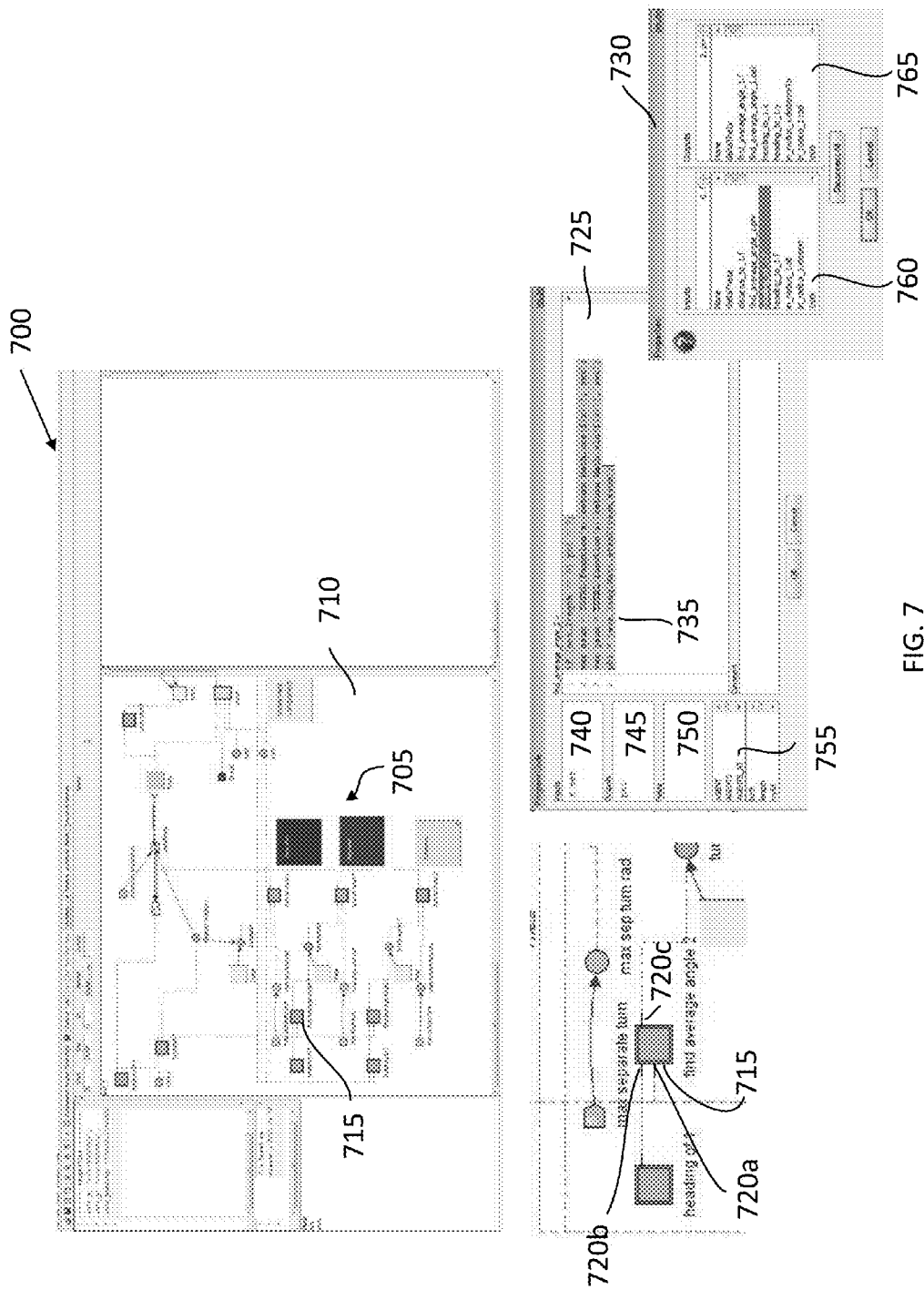
FIGS. 7-11C are views of graphical user interfaces illustrating exemplary models of computer implemented modeling systems and methods discussed in this document.

Add code chip 322 adds a new, that is, an empty code chip. In comparison to chips, code chips are configured within the visual language but extend that language with scripted functionality to enable complex model designs. Each code chip contains a textual high level programming language method, that is, in the form of JavaScript function. The code chip integrates the method's inputs and outputs through connections to the rest of the flow diagram, for example, as illustrated in FIG. 7. Code chips can be complete objects built from textual high level programming language code that include inputs and outputs and can retain states. In another example, code chips can have a plurality of inputs and/or outputs. In another example, code chips compute a set of data outputs or define one or more method functions usable in other components. In yet another example, code chips can be exported for reuse in other models/models. In another example, a library of code chips of commonly used functions for a given domain (or system) can be created and shared among applications. Each code chip can be defined (using a right mouse input, etc. that opens a custom designed GUI) by at least one of the following properties: inputs, outputs, fields, and a window for the script. Code chips can be copied, exported, and reused in other projects/models. In another example, the computer implemented modeling system can include a clocked chip that has its own clock that supports individualized timing specifications for submodels. For example, incorporating a clock chip provides the model the capability to have a clock tick one-hundred times (for example) every time an upper model ticks one time, providing multiple levels of time granularity. For example, clocked chips are incorporated in a model as a way to stage multiple runs with different parameters and for sensitivity analysis and other purposes.

Chips and code chips can be added to a model, for example, in the computer implemented modeling system using the drag and drop feature discussed in this document to create equivalent code chips. The encapsulation of the models in chips provides users of the computer implemented modeling system with a natural gesture tool, that is, drag and drop, to increase the efficiency and speed of the modeling system. For example, code chips with the same signature, e.g., having the same input and outputs, can be replaced with each other very quickly using the computer implemented modeling system by using the drag and drop feature and placing a code chip on top of an existing code chip or placing a code chip in another section of the model on any level of the model.

In the computer implemented modeling systems discussed herein, a user can drag and drop a capsule prototype onto an aggregator (container) to create many instances of the capsule prototype, that is, cloning or a proliferation of the resulting capsules and the capsule topological attributes. The user can quickly clone the capsule by selecting a number from a window that defines the number to create, therefore, creating clones of the capsule with an easy coding gesture (that is, gesture driven aggregation). In other words, the capsule (the program), an aggregator, and the addition of a simple gesture (right click opens a window where a number is entered or selected) will duplicate the capsule, including the complete structure and topological programing that the user specified in the original capsule.

Add table 324 adds a table to a model that shows a table of actual numbers from the model simulation. Table numbers can be exported for further analysis. Each table is defined (using a right mouse input, etc. that opens a GUI) by at least one of the following properties: table title, page size, page, pushpin button, select contents, alias, and refresh rate.

Add graph 326 adds a graph to a model. A graph can be used to display results of a model simulation. A graph added to the model canvas will also appear on the dashboard, both discussed in this document. In another example, a graph has the capability to simultaneously display multiple series/variables. In yet another example, a graph can be used to compare results of different model simulations. A model can have more than one graph and graphs can appear on different levels of a multi-level model. Each graph is defined (using a right mouse input, etc. that opens a GUI) by at least one of the following properties: graph title, page size, page, pin button, refresh rate, display, full time interval, graph type, select contents, color picker, scale/low/high, and alias. Further, a graph can include the modes normal and compare, can be saved in various formats, can be viewed for exact values and include zoom functionality.

Add slider 328 adds a slider or interactive control to the model. This interactive control allows a user to graphically, that is, with an input device like a mouse, change the value of parameters in the model. A model can have more than one slider. Sliders increase the speed and efficiency of exploring parameter values on the behavior or function of models. Each slider is defined (using a right mouse input, etc. that opens a GUI) by at least one of the following properties: low/high values, decimal places, pushpin button, and comments. Add spinner 330 adds a spinner to the model. A spinner is similar to a slider; however, a spinner has the ability to change values on an exponential scale. Each spinner is defined (using a right mouse input, etc. that opens a GUI) by at least one of the following properties: low/high values, decimal places, pushpin button, exponent, and comments.

Add arrow 332 adds an arrow to the model. Arrows can be used to connect components and pins to other objects in the model. Alternatively, displays, controls, and chips all use wireless connections. This means they don't have to be manually connected to other objects using arrow connectors. Instead, the user specifies in the computer implemented modeling system what other object(s) this component uses in its properties window. In the computer implemented modeling system on the modeling canvas, dotted lines provide a visual representation of how wireless components can be connected. Add label 334 adds a label to the model. Labels can be used on the model canvas and dashboard and can be simply used to annotate models for future reference and/or users.

In the illustrated example, plug-ins GUI 300b can include a plurality of the following user input buttons/icons: agent data plug-in 338, agent viewer plug-in 340, averager plug-in 342, bar graph plug-in 344, cascade plug-in 346, graph term plug-in 348, histogram plug-in 350, minsky 352, net viewer plug-in 354, perception 356, raster plug-in 358, signal generator 360, spy 362, and tabulator plug-in 364. A plug-in is an input/output component that provides enhanced visual displays and other extensions to the basic architecture. In another example, plug-ins GUI 300b can include additional plug-ins represented by additional plug-in 366 or do not include the number of plug-ins in the illustrated example. Non-limiting examples of plug-in functionality include at least one of the following: visualization of cell or node states, visualization of agent state and location, histogram visualization, and neural network visualization.

Further in the illustrated example, code chips GUI 300c can include a plurality of code chips 368 that can be added to the current level model by selecting one from the list displayed in code chips GUI 300c. As discussed, any number of code chips can be added to the computer implemented modeling system.

Averager plug-in 342 computes and outputs the running average of the sequence of values on its input. Further, averager plug-in 342 can include an input pin that provides the sequence of values (must be numbers) and an output pin that provides the running average of the input sequence.

Graph term plug-in 348 allows a user to incorporate real-world data into a model by importing data in CSV form (comma-separated values), for example, using the data to build a function, and then using the function(s) in models.

Histogram plug-in 350 inputs a sequence of values, and counts the number of values that fall into specified categories. The categories (called buckets) can be a sequence of intervals of a fixed width around a center value. The plug-in's face contains controls for specifying the number of intervals, the center point and the width of each interval. The value of each bucket (that is the number of elements in the input sequence that fall into the interval) is the output on the corresponding pin.

Signal generator 360 outputs a value that is specified by its control. A signal generator is defined (using a right mouse input, etc. that opens a GUI) by at least one of the following properties: low/high to determine a range of a spinner and decimal places to determine the precision of the spinner. Spy plug-in 362 displays its input as a numerical value and has an output that duplicates the input.

Agent data plug-in 338 provides access to agent location and trajectories. Raster plug-in 358 shows the contents of a cell matrix aggregate as tiles in a visual display. Agent viewer plug-in 340 shows the agent content of an agent vector or the agent and cell contents of a sim world aggregate as movable tokens and tiles in a visual display. Bar graph maker plug-in 344 converts data to a form that permits it to be viewed using a bar graph. Cascade plug-in 346 maintains a sequence of variables that pass values, possibly modified values, along the sequence. Minsky plug-in 352 is a macro plug-in that models the relationships in a particular financial system that uses the double entry bookkeeping system known as a Godley table. Net viewer plug-in 354 shows the contents of a cell network aggregate as nodes and connections in a visual display. Perceptron plug-in 356 models a perceptron-based multi-layer neural network capable of interacting with the standard components of the modeling system. Tabulator plug-in 364 produces sums of parameters drawn from the agents or cells of (respectively) an agent vector or cell matrix.

In computer implemented modeling system 200, macro plug-ins provide enhanced visual displays and other extensions, in addition, macro plug-ins convert model descriptions to actual textual high level programming language code. In another example, macro plug-ins import data from equations and other compact representations and can create an executable model.

In the computer implemented modeling system, aggregation can be done without a limit or ceiling in terms of hierarchy (model levels) or the number of models or capsules. For example, a user can create a simple small model, aggregate the model or reproduce the model at a higher level, and then can create a model at a higher level of hierarchy that is an aggregate of aggregate components. This can create a coherent and stable model. This factoring of a model (an element of an aggregate can be part of an aggregate or a container at another level) gives the model power and stability and allows a user flexibility of how to design and execute a model. For example, a user can design a model vertically and then design non-horizontal relationships using the same model.

In the computer implemented modeling systems described in this document, the system can include packing and unpacking functionality where the system can include structural resolution that allows a user to unpack a model at a level of its hierarchy in a way that the user can unpack the model and see how the model levels below it were previously aggregated. For example, a model can include a small model of children in a village wherein children of neighboring villages can be aggregated, and then a large number of villages in a county, state or the like can be aggregated. In this example, the model can include well defined structural boundaries including vertical and horizontal relationships that can be unpacked or packed using aggregators (or containers) and capsules as discussed in this document.

As discussed, each chip can encapsulate a single submodel instance. In an example of the computer implemented modeling system discussed in this document, large sets of submodels can be organized using aggregating components, including cell matrix, agent vector, sim world, cell/node network, and net world components as described in this document. Each aggregator maintains and provides access to a set of submodel components; however, each aggregator introduces a topological relationship among its components. The aggregator relationships become part of the model simulation through service functions provided by the aggregator to its contents. Service functions facilitate interaction among the constituents and provide information to the constituents regarding their topological position within the structure. Specifically, each visual aggregating component corresponds to a textual high level programming language object which actually implements the functionality.

The systems and methods discussed in this document can model and simulate complex real world concepts. The following non-limiting model types provide some examples. In some models, hybrid aggregators (containers including an aggregator) can combine some of the following exemplary model types. A model containing only stocks, flows, terms, and arrows that operates in the systems dynamics paradigm. A model substituting sequences in (a) for stocks operates as a discrete Markov process. For example, a Markov process can be a system that undergoes transitions from one state to another, where the next state depends only on the current state and not on the sequence of states that preceded it. A model containing as components one or more chips providing a multilayered model with the economy of reusable elements. A model containing as components one or more cell matrices or node networks simulates the spatial modeling paradigm to a layer of the project or model. Spatial modeling in the systems and methods described in this document is achieved whereby a set of submodels ("cells" or "nodes") can be positioned according to topologies. Exemplary topologies can include (but not limited to): two dimensional Cartesian coordinates where each submodel appears at an integer lattice point in a system and abuts 8 neighbors (an example of a neighborhood), two dimensional Hexagonal tessellation where each submodel is identified with a hexagonal tile in the tessellation and abuts six neighbors, and directed mathematical graph where each submodel is identified with a node in a pre-defined directed graph and neighborhoods can be defined by the connectivity of that graph.

A model containing one or more agent vectors simulates the agent-based modeling paradigm to that layer of the model. Agent-based modeling in the systems and methods described in this document is achieved by using a set of submodels ("agents" or a "plurality of agents") so that each agent can include parameters depicting its position in the space created by a topology. Exemplary topologies can include (but not limited to): two dimensional Cartesian coordinates where each submodel appears at an integer lattice point in a system and abuts 8 neighbors, two dimensional Hexagonal tessellation where each submodel is identified with a hexagonal tile in the tessellation and abuts six neighbors, and directed mathematical graph where each submodel is identified with a node in a pre-defined directed graph and neighborhoods can be defined by the connectivity of that graph. A model containing one or more sim worlds or net worlds can create a hybridized environment in which an agent vector is combined, respectively, with a cell matrix or node network. In this model, the location parameter of each of the agent vector's agents is mapped to corresponding coordinates in the associated cell matrix or node network. Hybrid models can include combinations of any of the previous described examples simulated as a submodel of a layer of a top level model. In a model simulation, including spatial topology, the plurality of agents modify the state of the cell matrix or cell network and/or the cell matrix or cell network modifies the plurality of agents. For example, an environmental sub-model at an identified position of a topological framework model can be configured to influence behavior of an agent sub-model at an identified position of the topological framework model by either constraining or enabling a behavior of the agent sub-model and the agent sub-model at the identified position of the topological framework model or is configured to alter a parameter of the environmental sub-model at the identified position of the topological framework model.

Figure 3D:
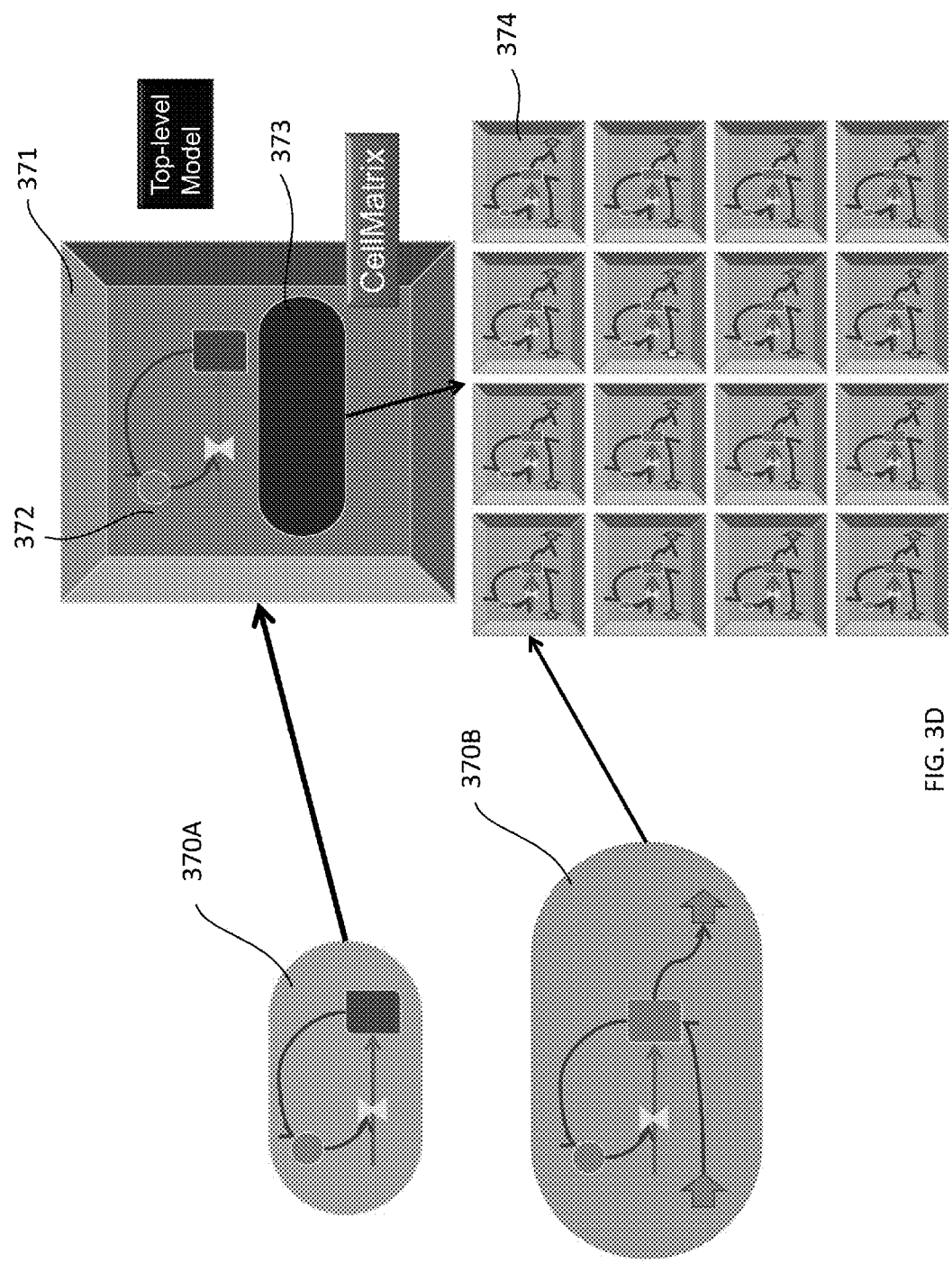
FIGS. 3D-3F are system block diagrams illustrating exemplary models having aggregators discussed in this document.
Figure 3E:
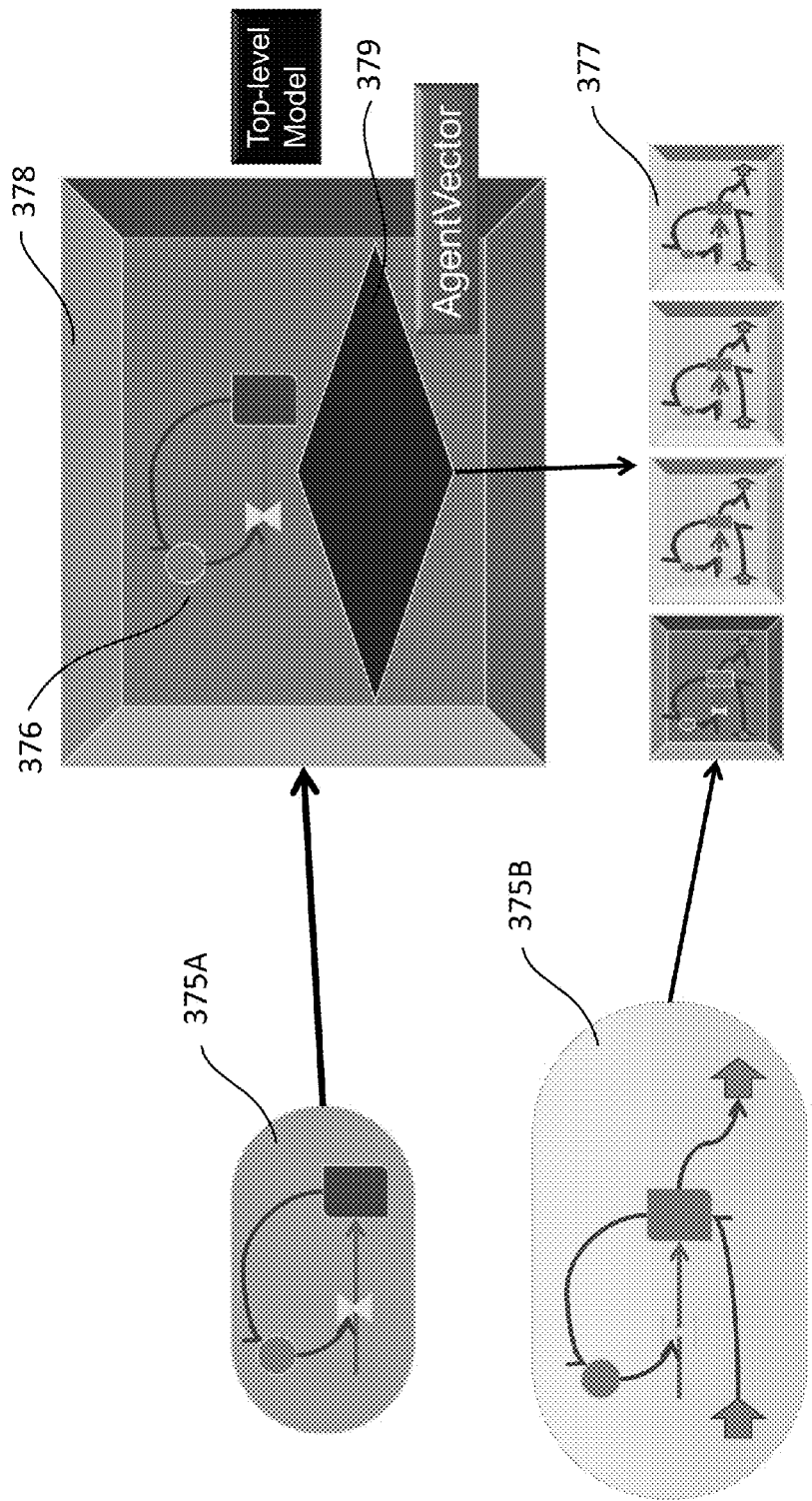
Figure 3F:
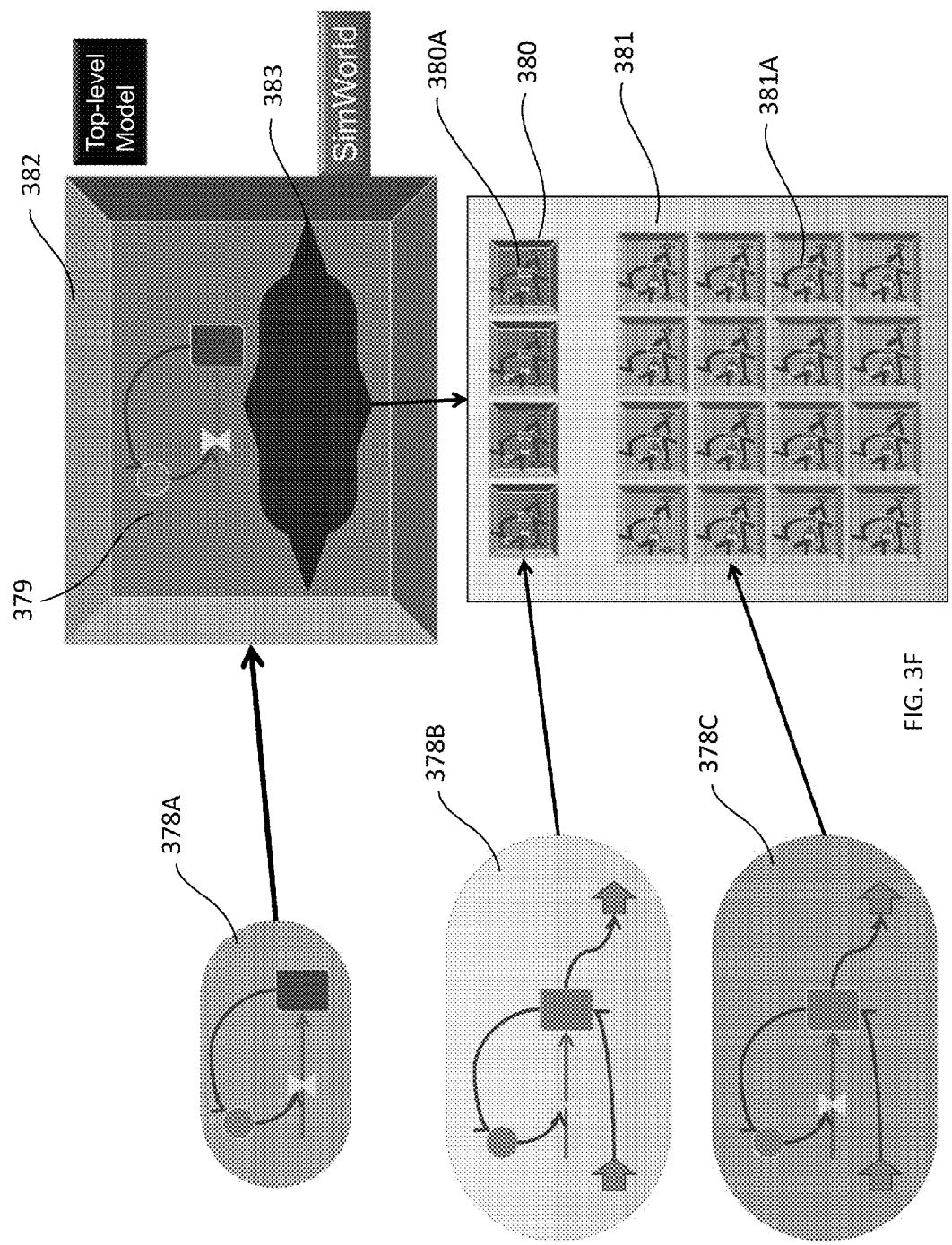

FIGS. 3D-3F are system block diagrams illustrating exemplary models having aggregators discussed in this document. FIG. 3D illustrates a model having a cell matrix. In this example, capsule prototypes 370A and 370B can be used to create capsule 372 and capsule 374, respectively. For simplicity, the interconnected components (stock, flow, etc.) in capsule prototypes 370A and 370B are substantially similar to the prototypes described in FIGS. 2C-2D, however, in another example they can be different. Further illustrated is top level model 371 containing capsule 372 and a cell matrix 373 (that is, a container) that defines a 4×4 cell matrix within the top level mode 371. The 4×4 cell matrix can include sixteen capsules 374 that can be created from capsule prototype 370B. Each of the sixteen capsules 374 can be the same or different depending on what they contain and how the parameters of the specific capsules can be set/adjusted. In another example, a cell matrix can be in submodel and communicate with a higher level model through a container that is a component of the higher level model.

FIG. 3E illustrates a model having an agent vector (a type of container). In this example, prototypes 375A and 375B can be used to create capsule 376 and capsule 377, respectively. For simplicity, the interconnected components (stock, flow, etc.) in capsule prototypes 375A and 375B are substantially similar to the prototypes described in FIGS. 2C-2D, however, in another example they can be different. Further illustrated is top level model 378 containing capsule 376 and an agent vector 379 that can include four capsules 377 that can be created from prototype 375B. Each of the four capsules 377 can be the same or different depending on what they contain and how the parameters of the specific capsule can be set/adjusted. In another example, an agent vector can be in a submodel and communicate with a higher level model through a container that is included in the higher level model.

Figure 3G:
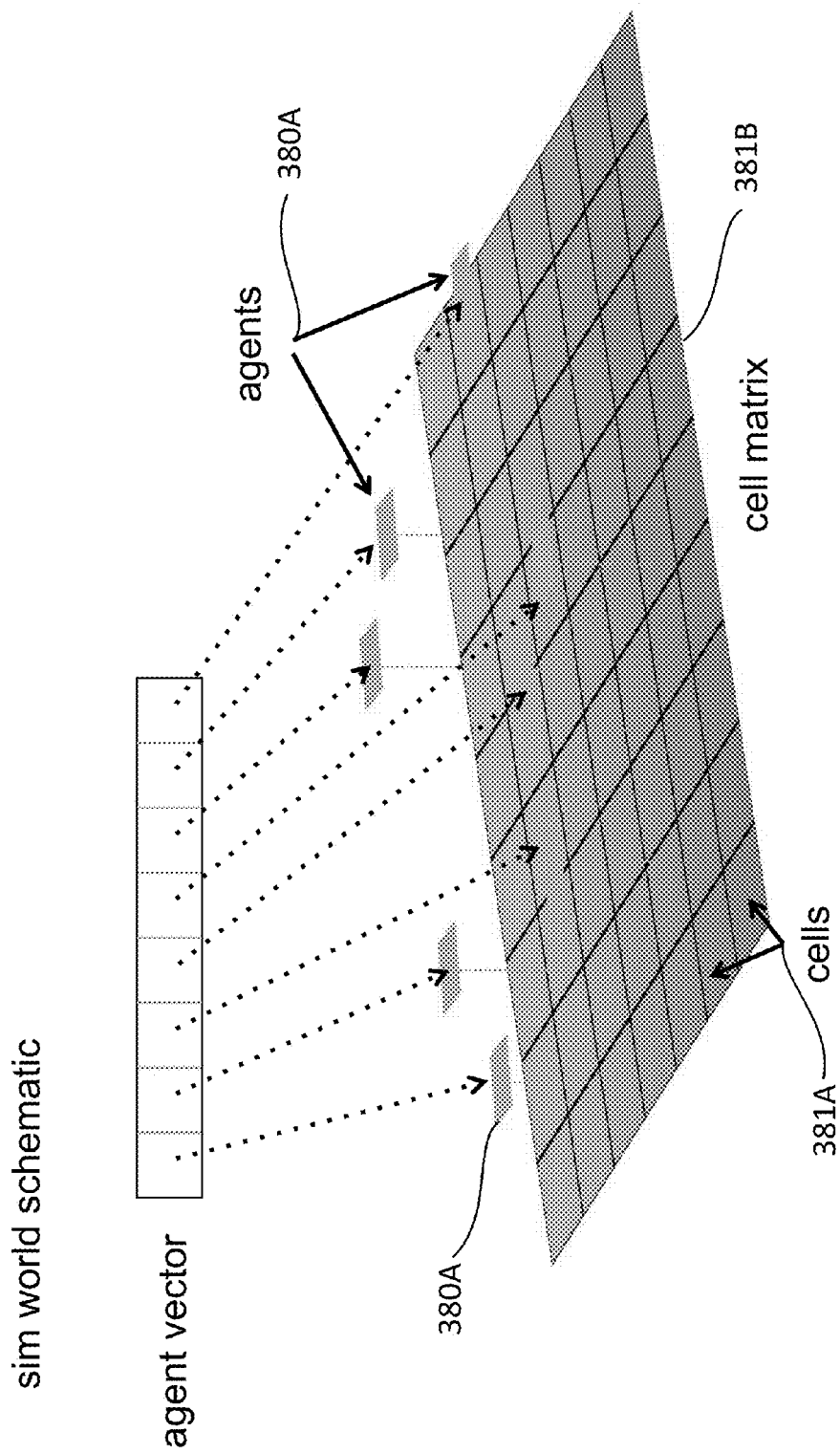
FIG. 3G is an illustration of a schematic of an exemplary aggregator.

FIG. 3F illustrates a model having a sim world. In this example, prototypes 378A, 378B, and 378C can be used to create capsule 379, capsule 380, and capsule 381, respectively. Again, the interconnected components (stock, flow, etc.) in capsule prototypes 378A, 378B, and 375C are substantially similar to the prototypes described in FIGS. 2C-2D, however, in another example they can be different. Further illustrated is top level model 382 containing capsule 379 and a sim world 383, including four agents 380A (defining an agent vector) in capsules 380 and sixteen cells 381A (defining a cell matrix) in capsules 381. Each of the four agents 380A can be the same or different design depending on the parameter settings of the agents. Similarly, each of the cells 381A can be the same or different design based on settings. In another example, a sim world can be in a submodel and communicate with a higher level model through a container that is included in the higher level model. In another example, the number of agents and/or the number of cells can be different than what is illustrated in FIG. 3F. FIG. 3G is an illustration of a schematic of an exemplary aggregators. FIG. 3G illustrates a schematic showing the position of the agents 380A relative to the cells 381A in the cell matrix 381B. In the schematic, eight agents 380A have locations in eight cells 381A in a cell matrix having a 7×9 configuration.

Figure 3H:
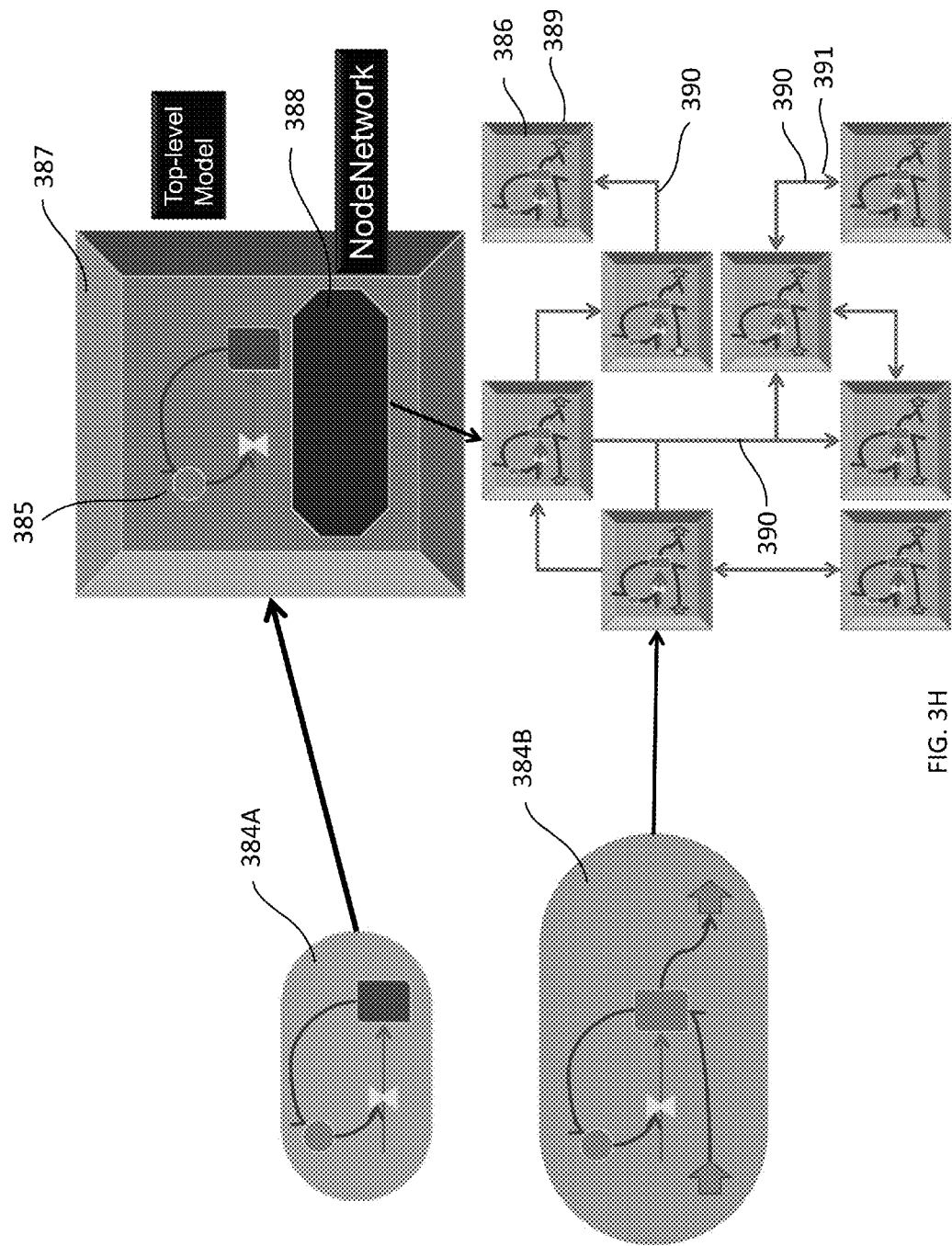
FIGS. 3H-3I are system block diagrams illustrating exemplary models having aggregators discussed in this document.
Figure 3I:
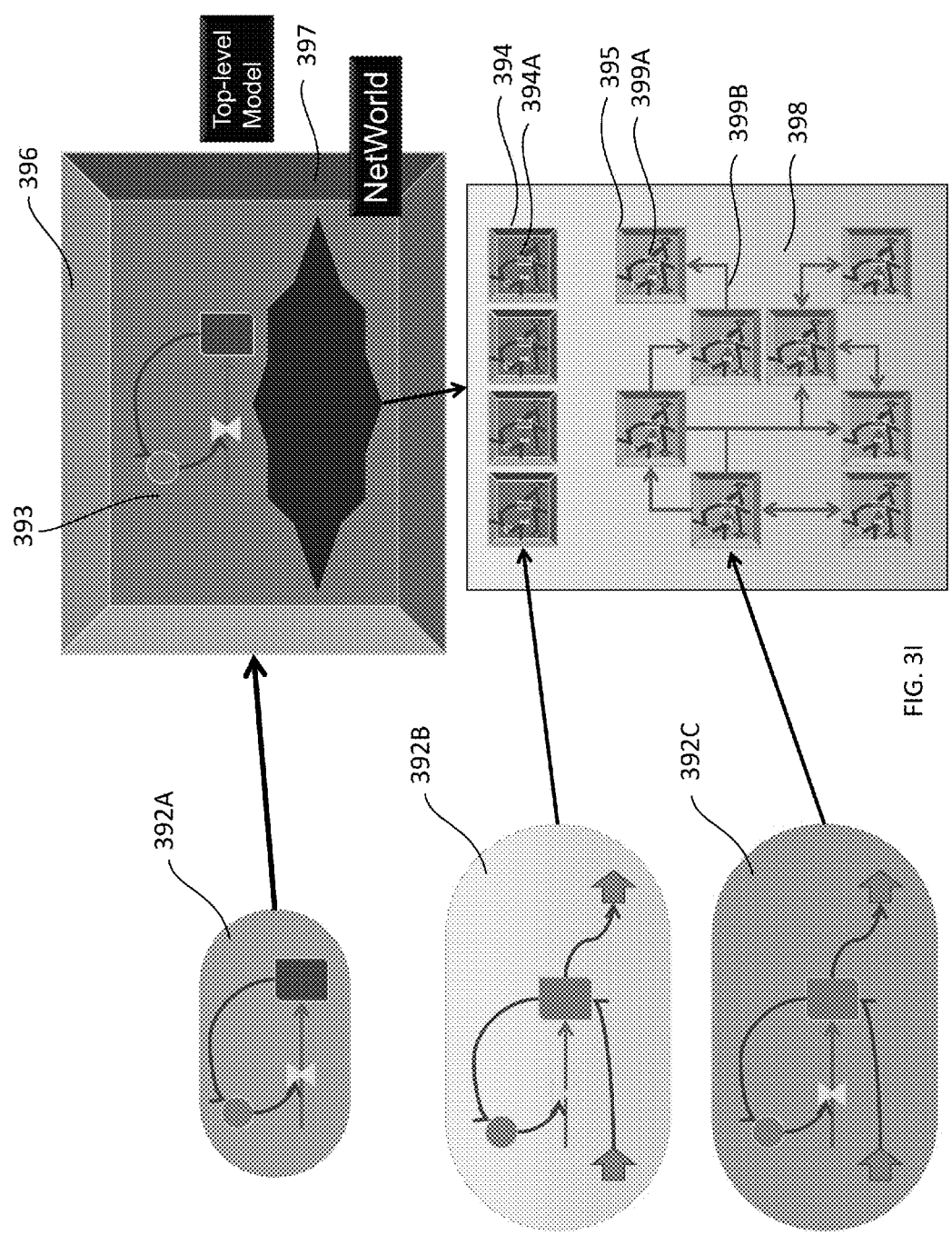

FIGS. 3H-3I are system block diagrams illustrating exemplary models having aggregators discussed in this document. FIG. 3H illustrates a model having a node network. In this example, prototypes 384A, and 384B can be used to create capsule 385 and capsule 386, respectively. The interconnected components (stock, flow, etc.) in capsule prototypes 384A and 384B are substantially similar to the prototypes described in FIGS. 2C-2D, however, in another example they can be different or have different components. Further illustrated is top level model 387 containing capsule 385 and a node network 388 containing eight nodes 389 connected by a plurality of arcs 390. The arcs define relationships between the nodes 389. For example, an arc 390 with arrow heads 391 on each end allows communication to flow in both directions between the connected nodes 389. Alternatively, an arc with an arrow on only one end only permits communication in one direction. There is no communication between nodes 389 if an arc does not provide a connection. In another example, a node network can be in a submodel and communicate with a higher level model through a container that is included in the higher level model. In another example, the number of nodes and the number of arcs can vary from the example illustrated in FIG. 3H.

Figure 3J:
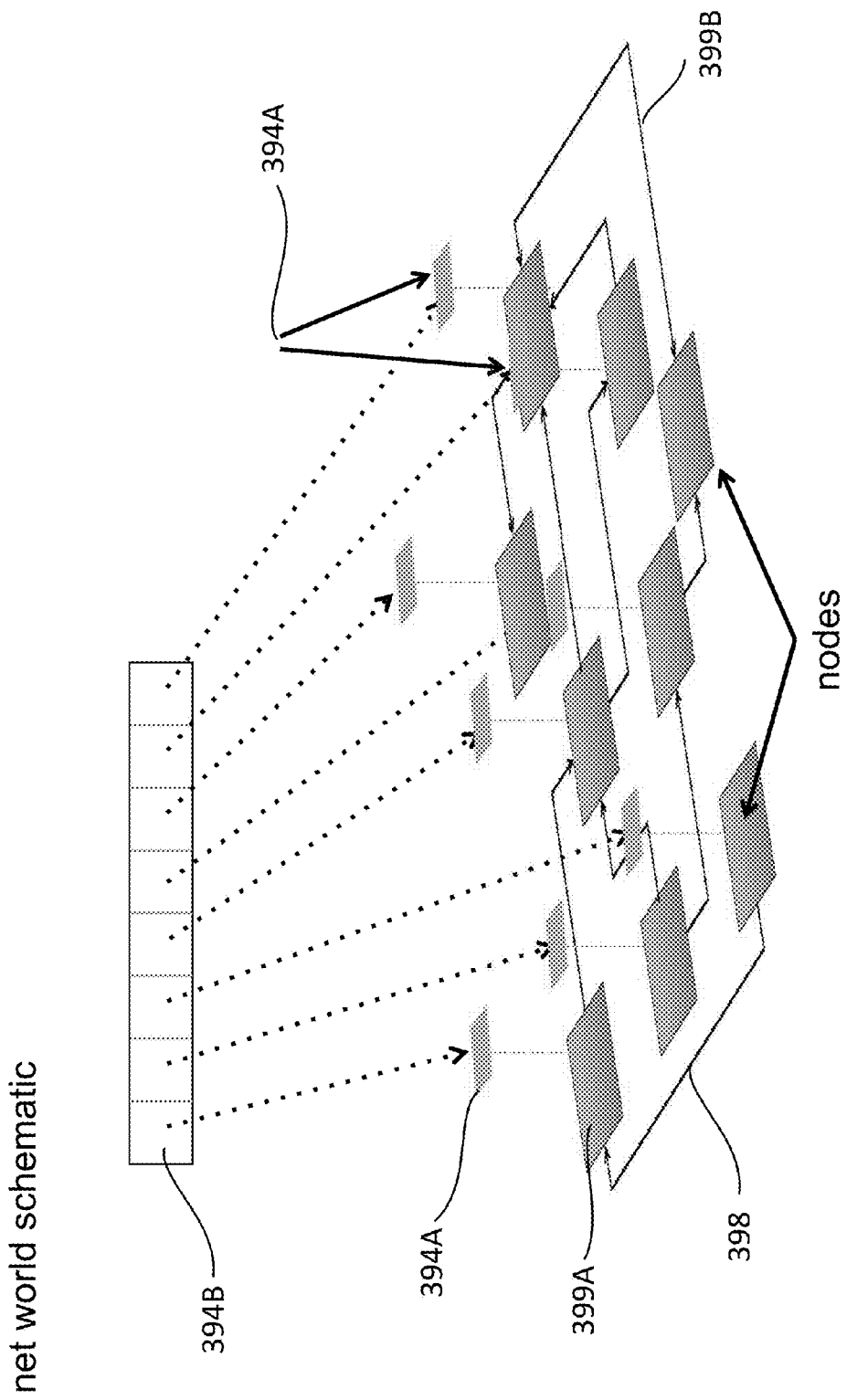
FIG. 3J is an illustration of a schematic of an exemplary aggregator.

FIG. 3I illustrates a model having a net world. In this example, prototypes 392A, 392B, and 392C can be used to create capsule 393, capsule 394, and capsule 395, respectively. Again, the interconnected components (stock, flow, etc.) in capsule prototypes 392A, 392B, and 392C are substantially similar to the prototypes described in FIGS. 2C-2D, however, in another example they can be different. Further illustrated is top level model 396 containing capsule 393 and a net world 397, including four agents 394A (defining an agent vector) in capsules 394 and a node network 398 containing eight nodes 399A connected by a plurality of arcs 399B, where the node network is substantially similar to the node network described above in reference to FIG. 3H and the four agents are substantially similar to the agents described above in FIG. 3F. FIG. 3J is an illustration of a schematic of an exemplary aggregator. FIG. 3J illustrates a schematic showing the position of the agents 394A in an agent vector 394B relative to the node network 398 containing eight nodes 399A connected by a plurality of arcs 399B. In the schematic, eight agents 394A have locations in the node network 398 and the agents 394A movement between nodes 399A is governed by arcs 399B.

Figure 4:
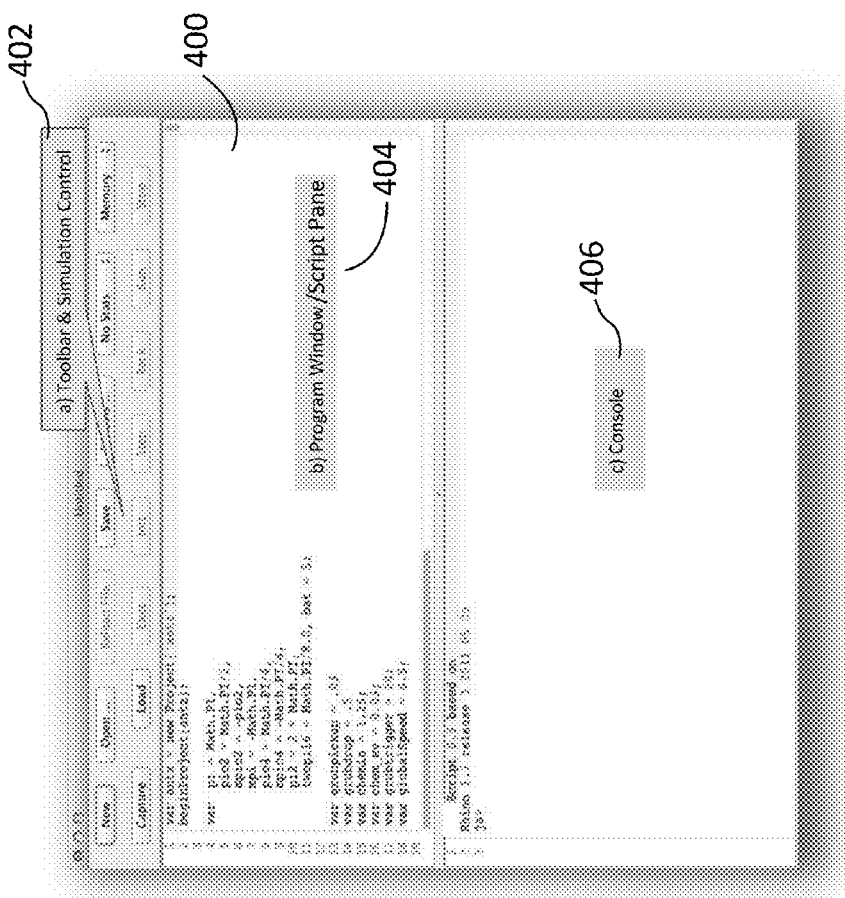
FIG. 4 is a view of another graphical user interface of modeling systems discussed in this document.

FIG. 4 is a view of another graphical user interface of modeling systems discussed in this document. Program window GUI 400 is optionally used in the computer implemented modeling systems discussed in this document. Program window GUI 400 can include toolbar and simulation control buttons 402 to manage code files and control simulation operation, respectively. Further illustrated is program window or script pane 404 that contains the textual high level programming language program of the current program or model, for example, the textual high level programming language program can be created in script pane 404 after the capture process is completed in the methods discussed in this document. Also illustrated is console 406, a duplicate of console 214 illustrated in computer implemented modeling system 200 in FIG. 2.

The computer implemented modeling system 200 discussed in this document can include the concept of creating a modular unit called a capsule. Each capsule is a complete model that interacts with its environment through an interface consisting of input and output channels, for example, data input 310 and data output 312 described in this document. A schema of textual high level programming language can be used to define the capsule. As discussed, schemas in textual high level programming language are used to define every type of object in textual high level programming language. In one example, a capsule might contain a stock and flow model. In another example, a plurality of capsules (called chips) appear in other capsules, assuming no circularity, communicating with their hosts through their input/output (I/O) channels. Inputs and outputs express how an output of one component is related to the input of another component. Each chip introduces into its host the functionality of that chips embedded or encapsulated model. Capsules can also be copied, exported, and reused in other models/models.

As models become more complex, computer implemented modeling system 200 can be modified using scripting in an algorithmic language. Computer implemented modeling system 200 has the capability of building complex models using a visual program, a scripted/textual program, or both a visual and scripted program. Further, the computer implemented modeling system can include code chips (described in this document), allowing the visual language to be extended by scripted components using textual high level programming language. As a result, computer implemented modeling system 200 distributes complexities of model design over a set of defined extensions in the functionality of each code chip.

In another example, the computer implemented modeling system can include or be designed into a model design kit that can be designed to address specific needs of a system or discipline, including tailored chips, code chips, plug-ins, macro plug-ins, and the like, that are designed to work in concert with the needs of a specific discipline.

Large textual high level programming language programs in the computer implemented modeling system discussed in this document, including those created by the capture process/mechanism, can be built as projects or models. A project bundles together a set of interacting definitions to produce a complete runnable model using schemas, which can be a design feature of textual high level programming language. A schema is a JavaScript object that serves as the class definition for creating the objects used by the simulation. Schemas can be used to specify each type of simulator, including a capsule, agent vector, cell matrix, cell network, and sim world. They also specify the control, display and plug-in proxies that serve as intermediaries between a running textual high level programming language program and the user interface.

A schema is a JavaScript object listing a set of properties. Schemas use two properties in their definition to specify the values of the object properties of the model. The schema property settings lists input and output connections between pairs of components. The value of the schema's settings property is also a generic object whose name/property value format conforms to the source and target of each connection.

A second schema property, dynamics, is a list of equations in the form of an array of strings. Each equation defines some property of a simulation component. This format has the advantage of reflecting much of the conceptual definition of the model. For example, in a population model having an equation such as pop prime=rate*pop, properties can be drawn from the underlying differential equation defining this model.

The other schema properties include the type of the scheme, for example, capsule, cell matrix, etc., its components, for example, stocks, flows, terms, variables, etc., any external displays, controls or plugins, and the settings and equations required by the object being defined in the schema. In addition, dashboard components, for example, tables, graphs, sliders, and spinners, can be also another type of schema, that is, poptable is an object of a proxy for a visible component on the dashboard. Further, each proxy schema can include a reference in the proxy property to the name of its corresponding dashboard component.

FIG. 5A is an illustration of a schematic illustrating the multi-level design capability of computer implemented modeling systems discussed in this document. A model 500 designed using computer implemented modeling system 200 and its multi-level design capability is illustrated. In the illustrated example, model levels 505, 510, and 515 represent at least a part of a multi-level model. For example, capsule or model 505 acts as a submodel to capsule or model 510 which in turn is a submodel to capsule or model 515. Models on different levels interact through precise input and output components called pins 520. In another example, a hierarchical model can be built by having one or more copies of a lower level model appear in a higher level as a submodel, using chip component 525 to contain each copy. In the illustrated example, for each pin appearing in its encapsulated submodel, chip 525 can create a connection point or pin 520, for example, pins for the input and output connections that can be represented by the short lines coming out of the chip, to allow interaction with the components in the higher level model.

Figure 5B:
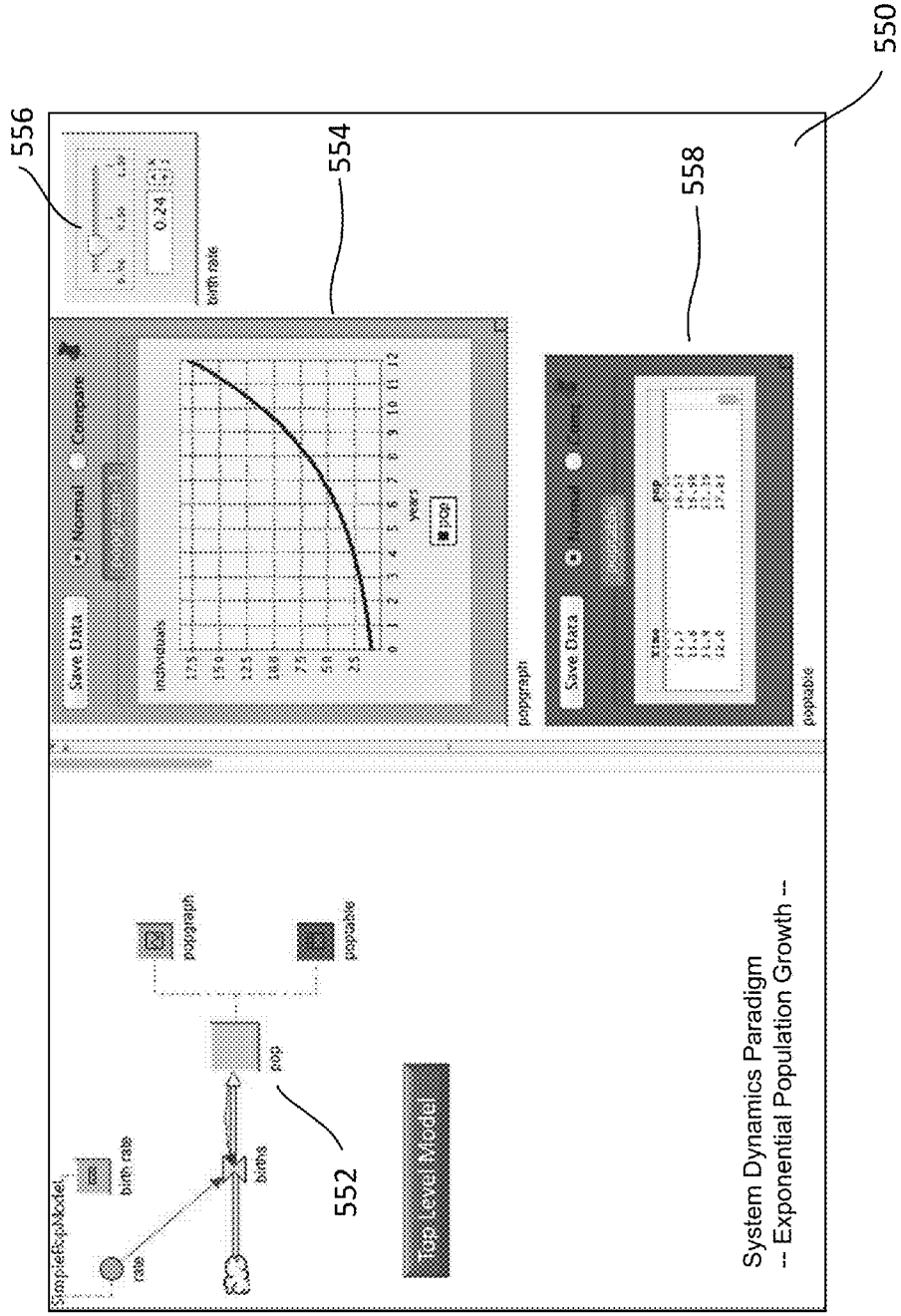
FIGS. 5B-5C are views of graphical user interfaces illustrating model design capability of computer implemented modeling systems discussed in this document.
Figure 5C:
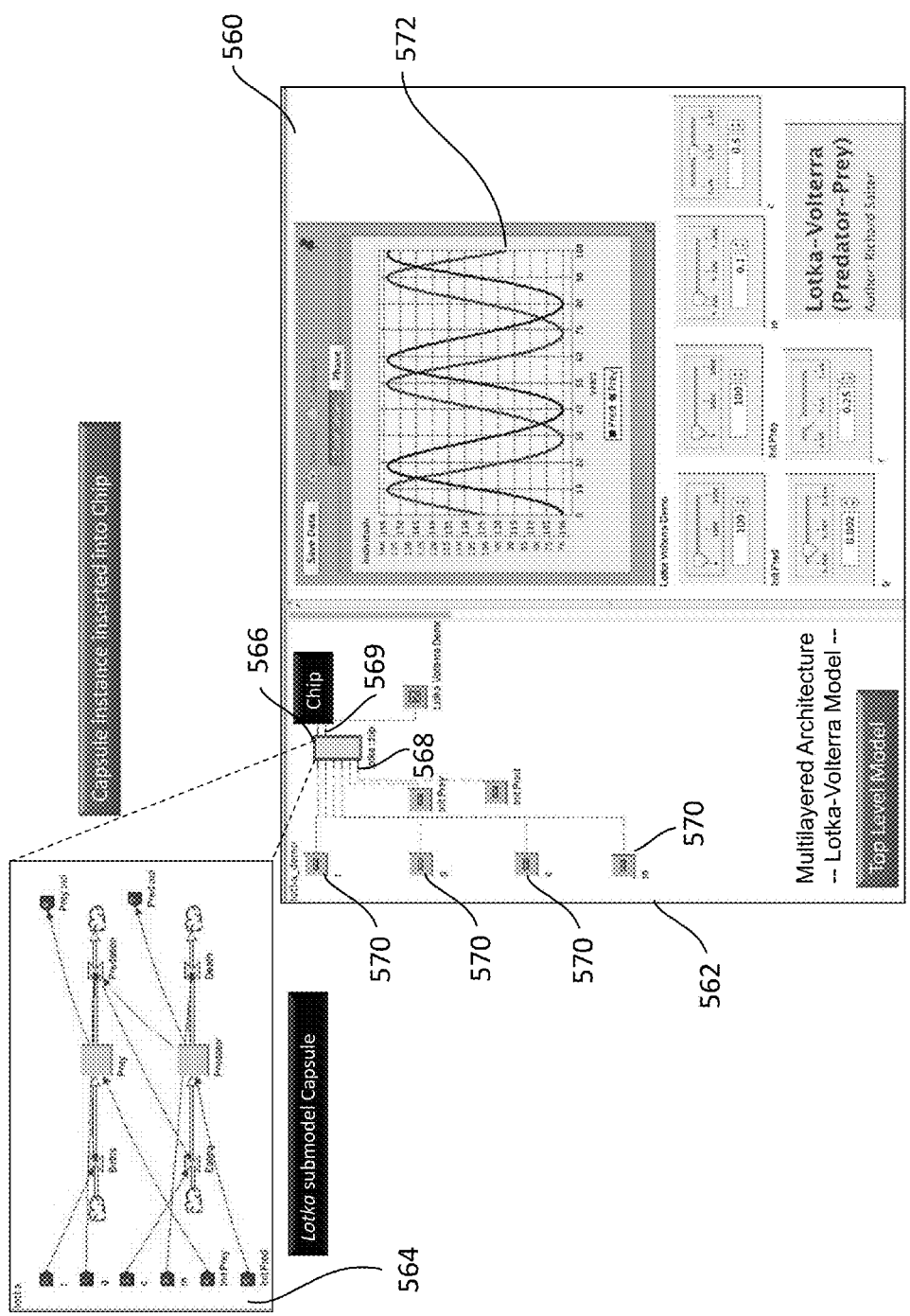

FIGS. 5B-5C are views of graphical user interfaces illustrating model design capability of computer implemented modeling systems discussed in this document. FIG. 5B illustrates another example of a model having a top level model 550 including a capsule 552 designed to simulate a system having system dynamic characteristics where capsule 552 can include a graph 554, a slider 556 to adjust a component of the model 550 and a table 558 to show tabular results of the model output. FIG. 5C illustrates an example of a model 560 having a top level model 562 and a submodel 564. Top level 562 can include a container 566 (for example, a chip, a clock chip, or an aggregator) having six input pins 568 and two output pins 569. The input pins 568 connect to adjustable input controls 570 located in the top level model 562. The input pins 568 transmit parameters to the submodel 564. The output pins 569 from the container 566 go to a graph 572 showing two sine waves for the model results output.

Figure 6:
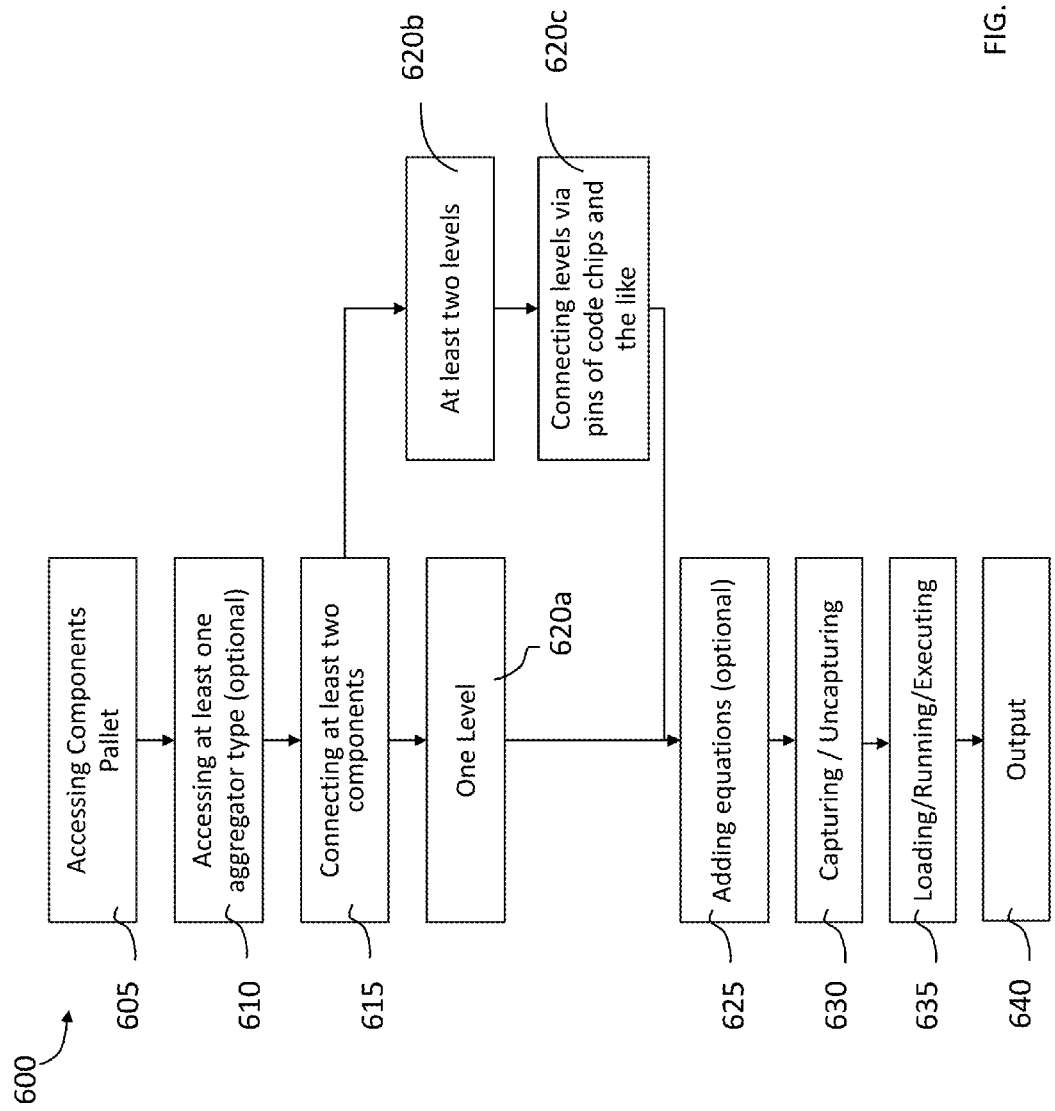
FIG. 6 is a flow diagram illustrating examples of a system and method described.

FIG. 6 is a flow diagram illustrating examples of a system and method described. A computer implemented modeling method 600 using the computer implemented modeling system discussed in this document is illustrated. A user or computer device accesses a components pallet in a graphical user interface of a computer device at 605 and accesses at least one aggregator at 610 (optionally). In another example, accessing an aggregator is optional, for example, in a simple model. In the illustrated example, the user or computer device connects at least two components, optionally including at least one aggregator, at 615. Method 600 can include a one level model at 620*a* or at least two level model at 620*b* that requires connecting the multiple levels with pins at 620*c*, that is, pins of code chips and other aggregators. At 625, coded equations can be added, although this is optional if the method includes aggregators having equations or computer expressions. At 630 the model goes through the capture process or through an uncapture process. At 635, the model is loaded and executed and optionally an output is displayed or saved at 640. In another example, the execute process can be continuous, run backwards, and can include debugging tools to provide information to show model values over the duration of the model.

FIGS. 7-11C are views of graphical user interfaces illustrating exemplary models of computer implemented modeling systems and methods discussed in this document. FIG. 7 illustrates a computer implemented modeling system 700, substantially similar to system 200, having a model 705 on model canvas 710. Model 705 can include components, plug-ins, and code chips discussed in this document. Specifically, model 705 can include code chip 715 which will be used for illustration purposes. Code chip 715 can include input/output connections 720*a*, 720*b*, and 720*c*. These inputs/outputs can be configured by the user using a program code GUI 725 and properties GUI 730. In the program GUI 725, a user can enter textual high level programming language in coding window 735, define inputs for the code chip using input window 740, define outputs for the code chip using input window 745, specify fields in fields window 750, and incorporate capsule and other programs into the code chip code from previously saved capsules and programs using capsule set window 755. As discussed, code chips have defined inputs and outputs that a user defines using properties GUI 730 where a user defines at least one input and at least one output using input window 760 and output window 765 (illustrated as scrollable lists).

Figure 8A:
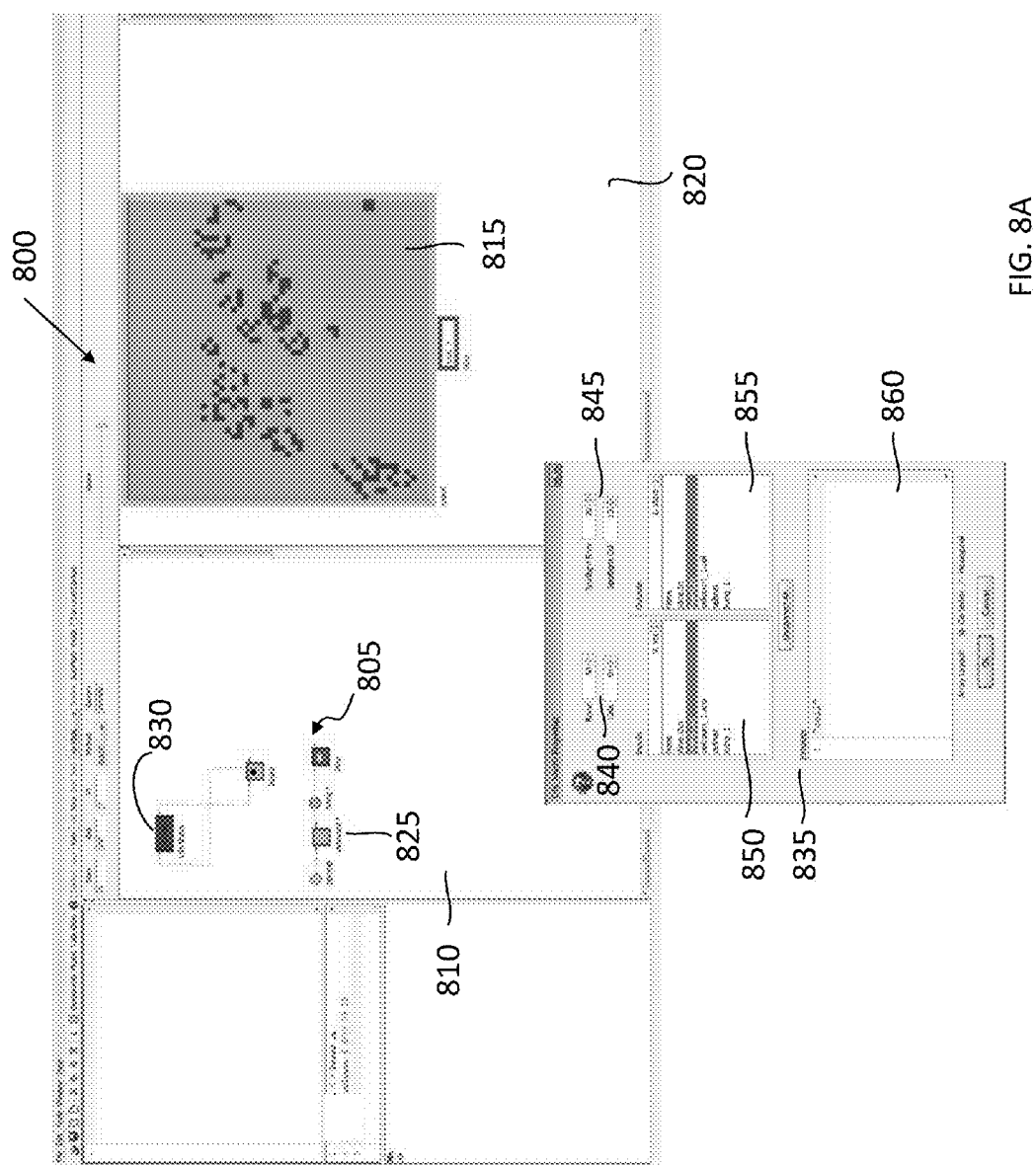

FIG. 8A illustrates a computer implemented modeling system 800, substantially similar to system 200, having a spatial model 805 on model canvas 810 and a game board 815 (simulated using a cell matrix) on dashboard 820. Model 805 simulates the "Game of Life" and can include components discussed in this document, including a code chip 825 and a cell matrix 830 aggregator as described in this document. The Game of Life is drawn from literature for exemplary purposes to illustrate how the computer implemented modeling system discussed in this document and its various features can apply to different types of modeling situations. In the Game of Life, each tile in the cell matrix is defined to be either "alive" or "dead." This is done using cell matrix 830 with the use of a simple 1 for alive and 0 for dead. For informational purposes, the rules of the Game of Life include the following: if you have 1 or less living neighbors, you die or remain dead (loneliness), if you have 2 living neighbors, you remain dead or remain alive (persist), if you have 3 living neighbors, either come to life if you are dead, or stay alive, if you are already alive, and if you have 4 or more living neighbors, you die or remain dead (overcrowding). In a 2-dimensional cell matrix, each tile has a total of 8 neighbors (except for the boundary tiles). The way the cells actually work, is by having a cell count the number of "alive" neighbors around it (neighbors can be computed at the beginning of the simulation in code chip 825 and stored in its property); the result of the computation sends either a 1 or a 0 through a flow and into a stock which is set to be a discrete value, meaning its value is reset every turn. In another example, users have the ability to click on tiles of the cell matrix before the run, and change their state in order to change initial conditions.

A user of model 805 can quickly and easily add cell matrix 830 to model 805 by defining its properties in cell matrix properties window 835. Cell matrix properties window 835 can include user adjustable row and cell inputs 840 to change the size of the cell matrix, user adjustable spotlight row and spotlight column inputs 845, input 850, output 855, and initializer 860. The computer implemented modeling system's (200 and other systems in this document) version of this system is built on a visual design that portrays cell state transition through the metaphor of the stock/flow paradigm. This model also illustrates the manner by which the cell matrix aggregator of computer implemented modeling system 200 provides topological information to each individual cell using primitive functions. Further, the computer implemented modeling system 200 illustrates the use of code chips to embed or encapsulate the individual actions of determining, for each cell, the set of neighboring cells, and defining the cell's state transition according to the rules of the simulation.

Figure 8B:
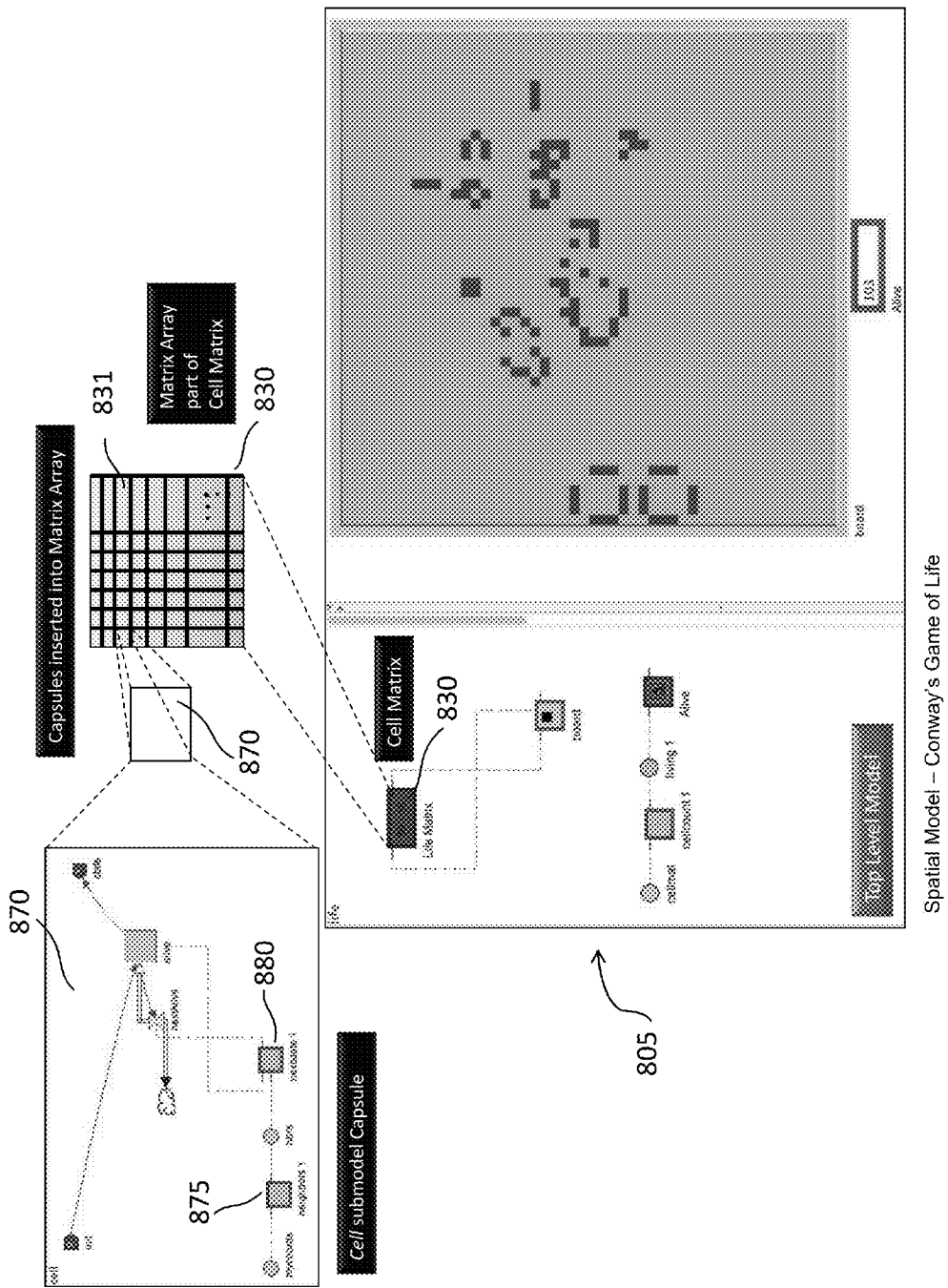

FIG. 8B illustrates the model 805 from FIG. 8A and further illustrates submodel 870 and cell matrix 830. The cell matrix 830 represents a 50×50 spatial grid for display of the model output(s). Submodel 870 is a capsule that is added to each cell or position of cell matrix 830. The submodel 870 is illustrated as a square that embeds in one or more positions 831 of the cell matrix 830. For example, this submodel 870 determines neighbor states and next state for each cell based on the algorithm contained in chip 875 and chip 880, respectively. This model can include an exemplary spatial topology simulation.

Figure 9A:
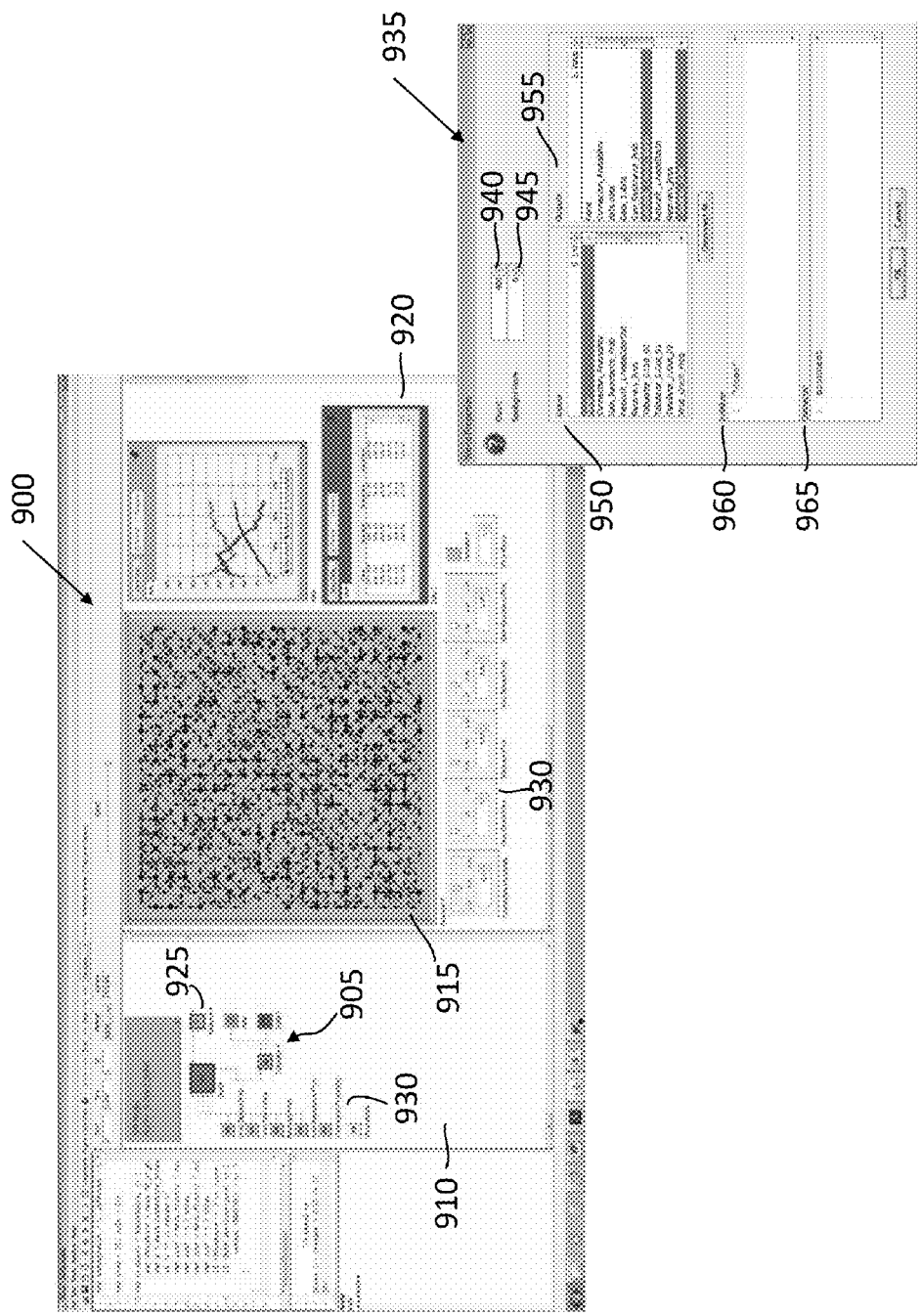

FIG. 9A illustrates a computer implemented modeling system 900, substantially similar to system 200, having a model 905 on model canvas 910 and a network 915 on dashboard 920. Model 905 simulates a plurality of cells having a network using a "Network SIR" model and can include components discussed in this document, including a cell network 925 aggregator and a number of sliders 930, for example, as described above. These components can be used to model and simulate interaction between cells where each cell is represented by a submodel or capsule as described. For example, a SIR (susceptible-infected-resistant) model may demonstrate the spread of infection (for example, biological or computer malware) through a population. Initially, each node is either susceptible or infected. At each time point an infected node may spread the infection to neighboring susceptible nodes in the network. An infected node remains infected for some length of time after which it is becomes resistant and is no longer able to be infected.

The Network SIR example is again drawn from literature for exemplary purposes to illustrate how the computer implemented modeling system and its various features can apply to different types of modeling situations. In this example, an email system network is modeled where each infected node (colored red or darker gray) attempts to infect all of its neighbors. Susceptible neighbors (colored green or lighter gray) will be infected with a probability given by the VIRUS-SPREAD-PROB slider. This might correspond to the probability that someone on the susceptible system actually executes the infected email attachment (for example). Resistant nodes (colored black) cannot be infected. This might correspond to up-to-date antivirus software and security patches that make a computer immune to this particular virus. In this example, infected nodes are not immediately aware that they are infected. Only every so often (determined by the VIRUS-CHECK-FREQ slider) do the nodes check whether they are infected by a virus. This might correspond to a regularly scheduled virus-scan procedure, or simply a human noticing something fishy about how the computer is behaving. When the virus has been detected, there is a probability that the virus will be removed (determined by the RECOVERY-PROB slider). If a node does recover, there is some probability that it will become resistant to this virus in the future (given by the GAIN-RESISTANCE slider). In the illustrated example, a user of computer implemented modeling system 900 can quickly and easily add cell network 925 to model 905 by defining its properties in cell network properties window 935. Cell network properties window 935 can include user adjustable count 940 to define the size of the nodes or objects in a network, spotlight node 945, input 950, output 955, initializer 960, and connector 965. The computer implemented modeling system's (200 and other systems discussed in this document) version of this system is built on a visual design that portrays node state transition through the metaphor of the stock/flow paradigm. The component network for each node is a flowchart portraying the logic used for such state transitions. This computer implemented modeling system's model also illustrates the manner by which the cell network aggregator provides connectivity information to each individual node using primitive functions. Finally, extension of the logic portrayed by the component network may be encapsulated by a code chip.

Figure 9B:
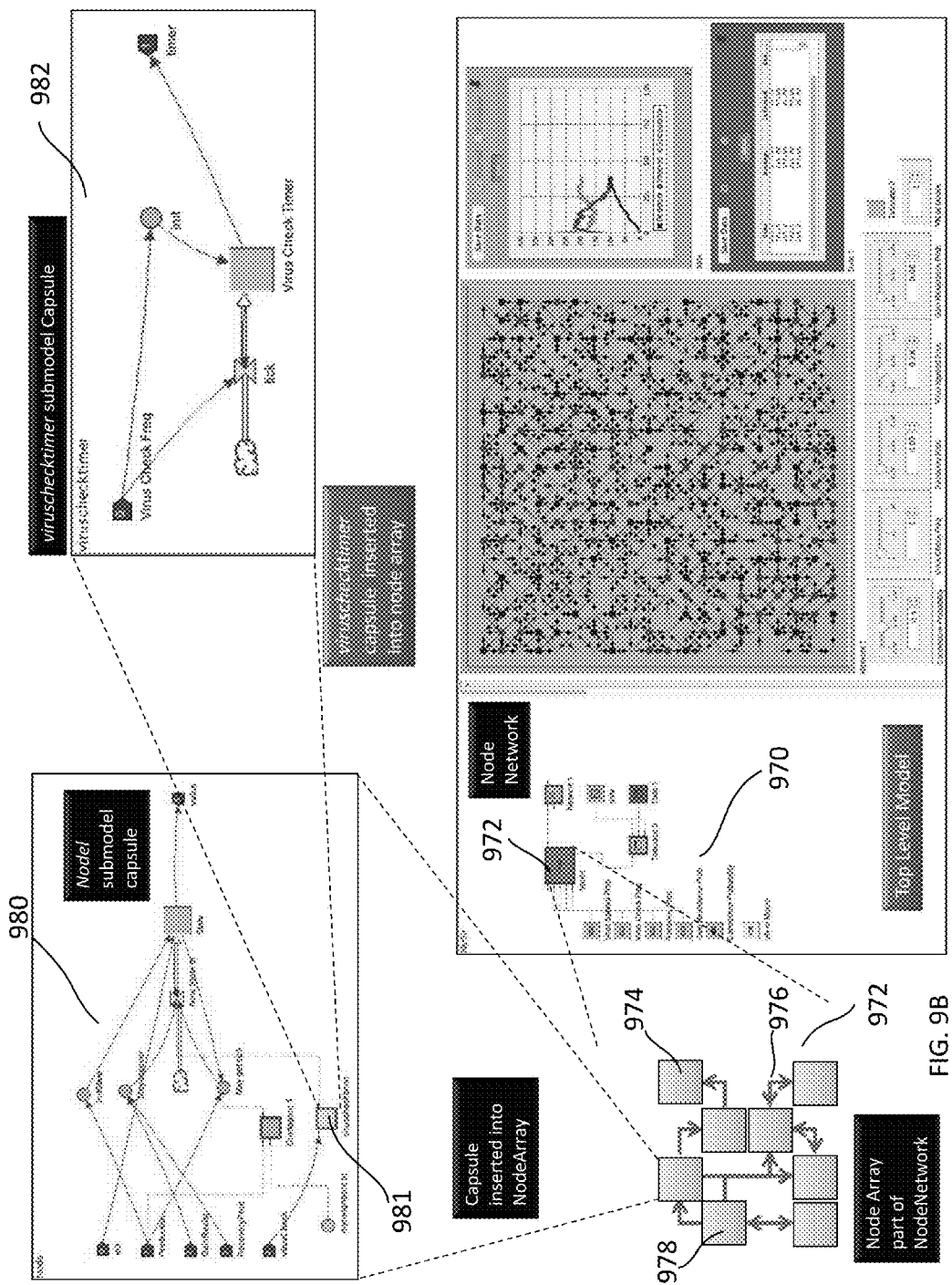

FIG. 9B illustrates a model 970 having spatial or topological simulation characteristics. Model 970 can include a node network 972 having a node array (a one dimensional array of nodes) including eight nodes 974 and a plurality of arcs 976, for example, a node network substantially similar to the node network explained above in reference to FIG. 3H. Each node 974 can include a capsule 978 that contains first submodel 980. The node network may also include an interface. Also illustrated in this example is a second submodel 982 that is a submodel to first submodel. Second submodel 982 is connected to a component 981 (for example, a code chip) in first submodel 980 that is connected to model 970.

Figure 10A:
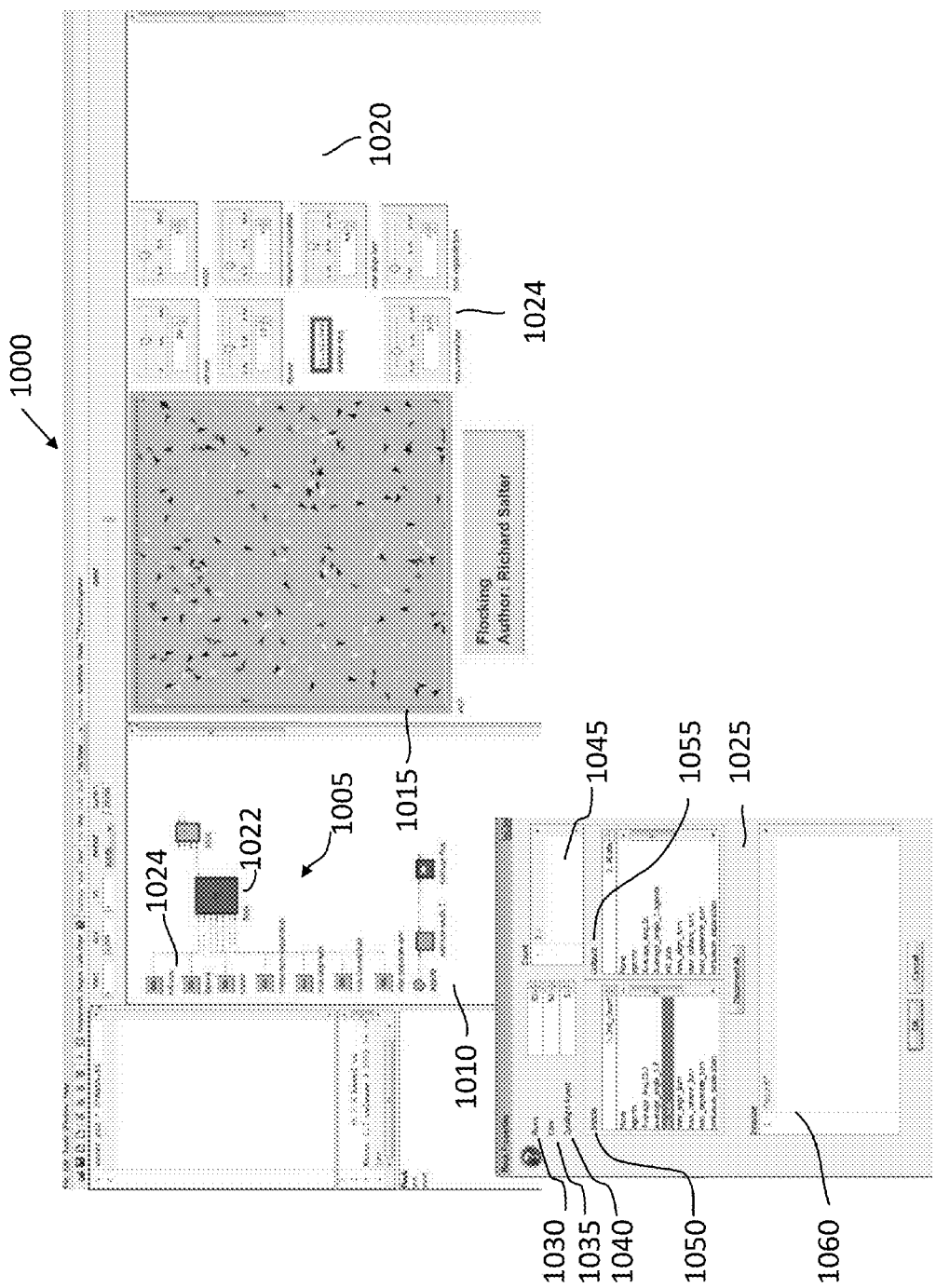

FIG. 10A illustrates a computer implemented modeling system 1000, substantially similar to system 200, having a model 1005 on model canvas 1010 and an agent vector 1015 on dashboard 1020 wherein the agent vector connects to the agent vector plug-in. Model 1005 simulates a flock of birds using a "Flock" model and can include components discussed, including an agent vector 1022 aggregator and a number of sliders 1024, for example, as described above. These components can be used to model and simulate a flock of birds flying in the sky by modeling each bird as a stand-alone agent or capsule that operates independently while interacting with other agents/capsules while being dynamic, that is, moving between cells. In the Flock model, the birds follow three rules: "alignment", "separation", and "cohesion." "Alignment" means that a bird tends to turn so that it is moving in the same direction that nearby birds are moving. "Separation" means that a bird will turn to avoid another bird which gets too close. "Cohesion" means that a bird will move towards other nearby birds (unless another bird is too close). When two birds are too close, the "separation" rule overrides the other two, which are deactivated until the minimum separation is achieved. The three rules affect only the bird's heading. Each bird always moves forward at the same constant speed. Three TURN-ANGLE sliders control the maximum angle a bird can turn as a result of each rule. VISION is the distance that each bird can see 360 degrees around it. In the illustrated example, a user of computer implemented modeling system 1000 can quickly and easily add agent vector 1022 to model 1005 by defining its properties in agent vector properties window 1025. Agent vector properties window 1025 can include user adjustable rows 1030 and columns 1035 to define the size of the agent vector model area. Further, agent vector properties window 1025 can include spotlight agent 1040, count 1045, inputs 1050, outputs 1055, and initializer 1060. While the algorithm used for this model is well known, the computer implemented modeling system (200 and other systems discussed in this document) enables its construction as an executable flowchart. Each feature of the logic used to determine bird behavior is encapsulated in a set of connected code chips. Information is provided by the enclosing agent vector regarding the position of neighboring birds.

Figure 10B:
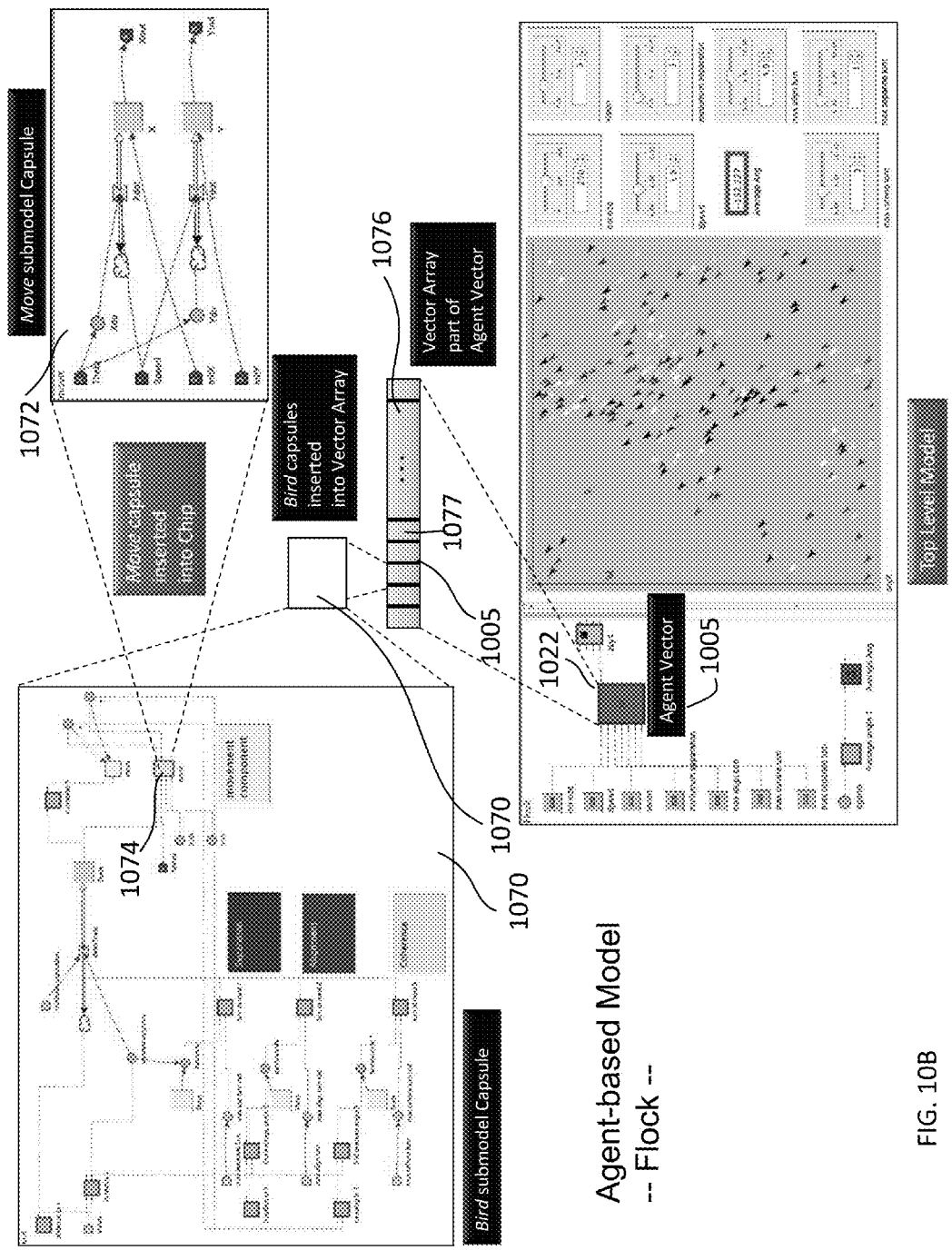

FIG. 10B illustrates the model 1005 from FIG. 10A having a first submodel 1070 and a second submodel 1072. This illustrates how a level of models can be configured to simulate an agent-based model, for example a flock of birds. A capsule of second submodel 1072 is connected by input and output connections to a chip 1074 in first submodel 1070. A plurality of capsules of first submodel 1070 can be connected by input and output connections to vector array 1076 having a plurality of objects 1077 in agent vector 1022 of model 1005. The agent vector 1022 holds two-hundred and fifty capsules of a submodel 1072, one in each of its slots. The first submodel 1070 is illustrated as a square that embeds in one or more objects 1077. The submodels include methods to learn about the position of nearby agents (neighbors) and the agent's direction of movement using an algorithm. The second submodel 1072 can be designed to simulate movement of the agent.

Figure 11A:
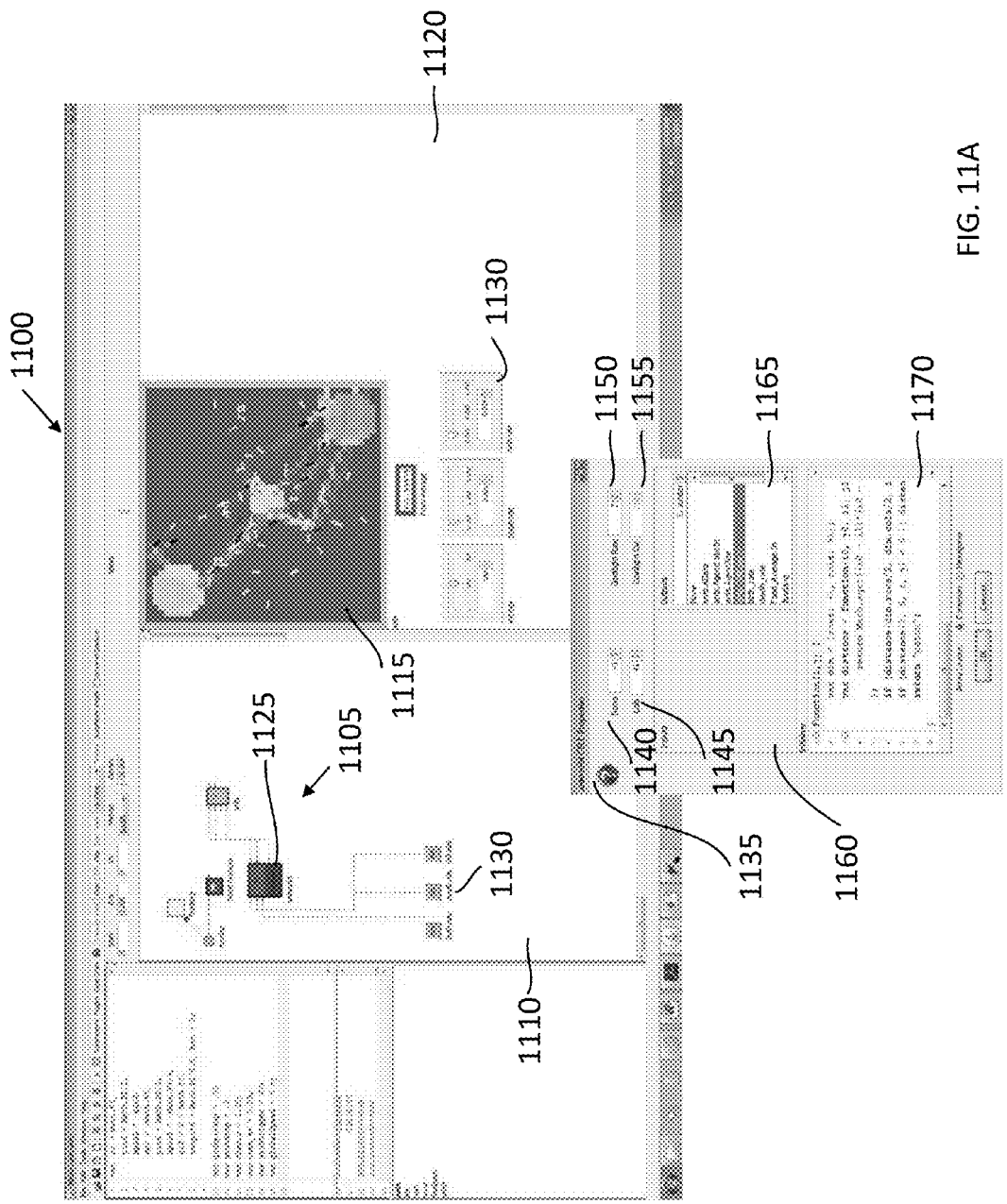

FIG. 11A illustrates a computer implemented modeling system 1100, substantially similar to system 200, having a model 1105 on model canvas 1110 and a sim world 1115 illustrated in dashboard 1120. Model 1105 simulates ants feeding on two sources of food and can include components discussed in this document, including a sim world 1125 aggregator and a number of sliders 1130, for example, as described above. In the "Antz" model, the behavior of ants can be simulated as they go from a central nest and search for food. Once the ants find food, they release a pheromone that allows other ants to follow their path in order to find their way to the food. Ants also have some probability of giving birth while in the nest, and some probability of dying anywhere. In this model, ant and patch color change depending on how much food they are carrying. This model can include some complex movement characteristics that allow for interesting group behavior modeling between the ants. There can be multiple tile types used within the model that illustrates a diverse cell matrix for the agents to interact on. In the illustrated example, a user of computer implemented modeling system 1100 can quickly and easily add sim world 1125 to model 1105 by defining its properties in sim world properties window 1135. Sim world properties window 1135 can include user adjustable rows 1140 and columns 1145 to define the size of the cell matrix of the sim world. Further, sim world properties window 1135 can include spotlight row 1150, spotlight column 1155, inputs 1160 (not used in this model), outputs 1165, and initializer 1170 that can include textual high level programming language in this model.

While the algorithm used for this model is well known, the computer implemented modeling system (200 and other systems discussed in this document) enables its novel construction as a multilevel set of executable models. In this model there can be three different capsule prototypes used for cells, representing the nest, food sources and other locations. Ant behavior is defined by a single capsule that relies on the enclosing sim world for information regarding the position of other ants and the presence of food and chemical in the cells. Ant behavior is controlled by code chips that effect "billiard-ball"-like bounces off of the boundaries, and determine trajectories to food and chemical deposits. The computer implemented modeling system's (200 and other systems discussed in this document) model also illustrates the use of an imported submodel for movement that can be used in several other agent-based examples.

Figure 11B:
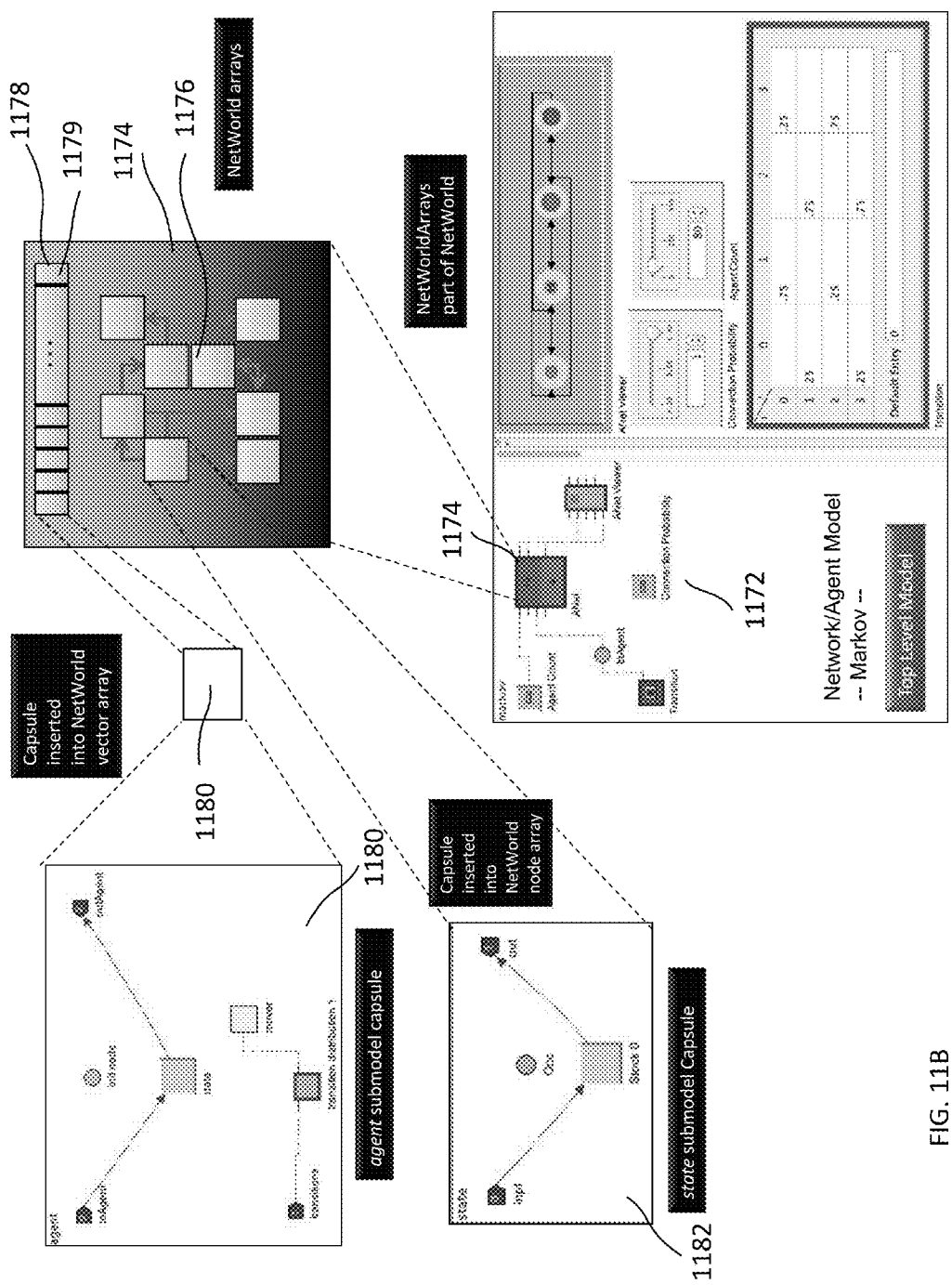

FIG. 11B illustrates a model 1172 having a net world array 1174 supported by a first submodel 1180 and a second submodel 1182. Net world array 1174 can include net world 1176 and a vector array 1178. The net world 1176 is duplicated in the model based on the number of components/instances of the vector array 1178. The first submodel 1180 is illustrated as a square that embeds in one or more objects 1179 of vector array 1178. Further, capsules of second submodel 1182 can be inserted into net world 1176.

Figure 11C:
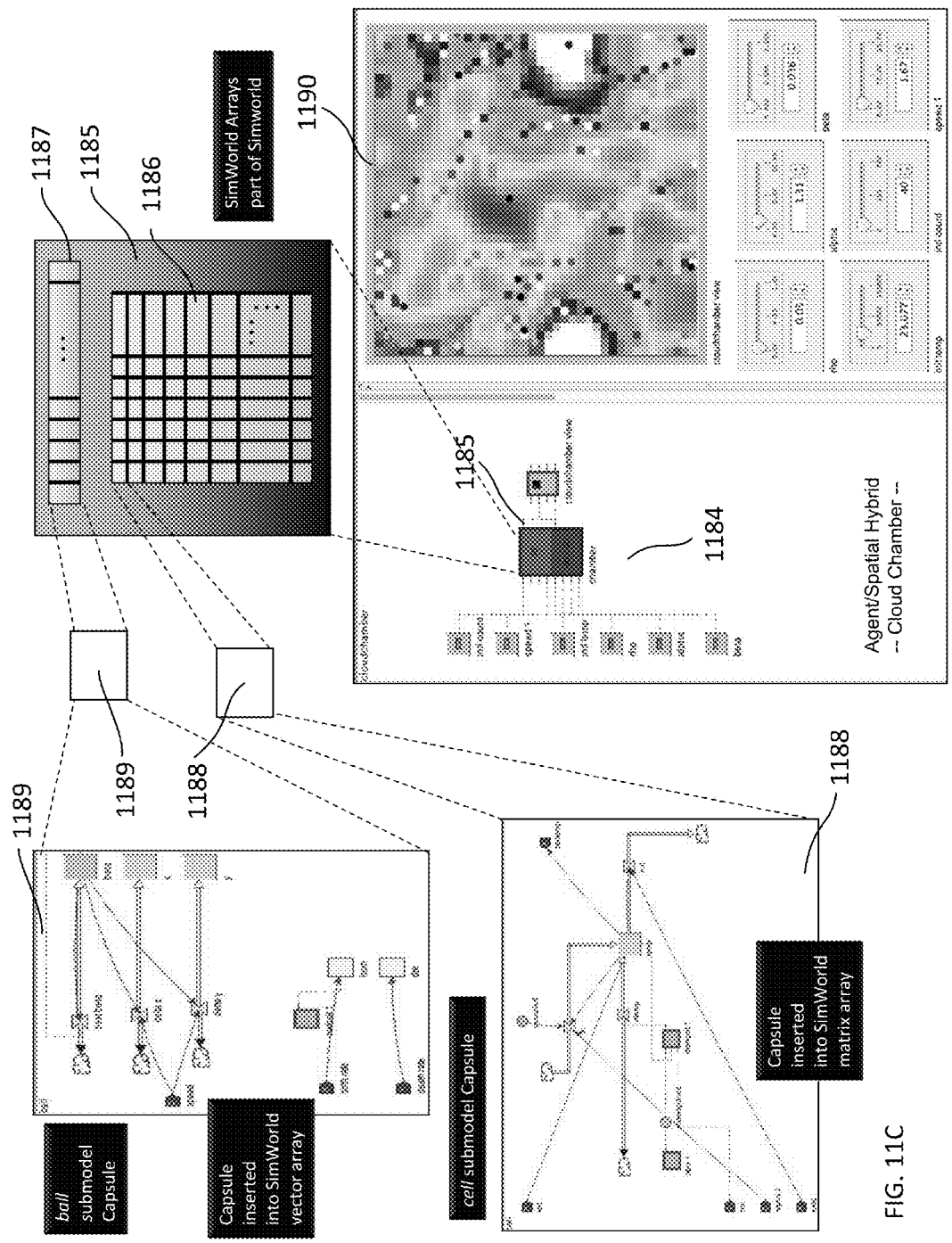

FIG. 11C illustrates a model 1184 having a sim world array 1185 including a cell matrix 1186 and an agent vector 1187. Cell matrix 1186 can create a 50×50 spatial grid 1190 and the agent vector 1187 can create a number of agents that interact with the cells in the spatial grill 1190. A capsule of first submodel 1188 is inserted into each cell or location of cell matrix 1186, this is illustrated as a as a square that embeds in one or more cells or locations of the cell matrix 1187. Further, a capsule of second submodel 1189 is inserted into each slot of agent vector 1187, this is illustrated as a second square 1189 that embeds in one or more cells or locations of the cell matrix 1077. The sim world feature of this model allows the agents to interact with neighbors (adjacent agents).

Figure 12:
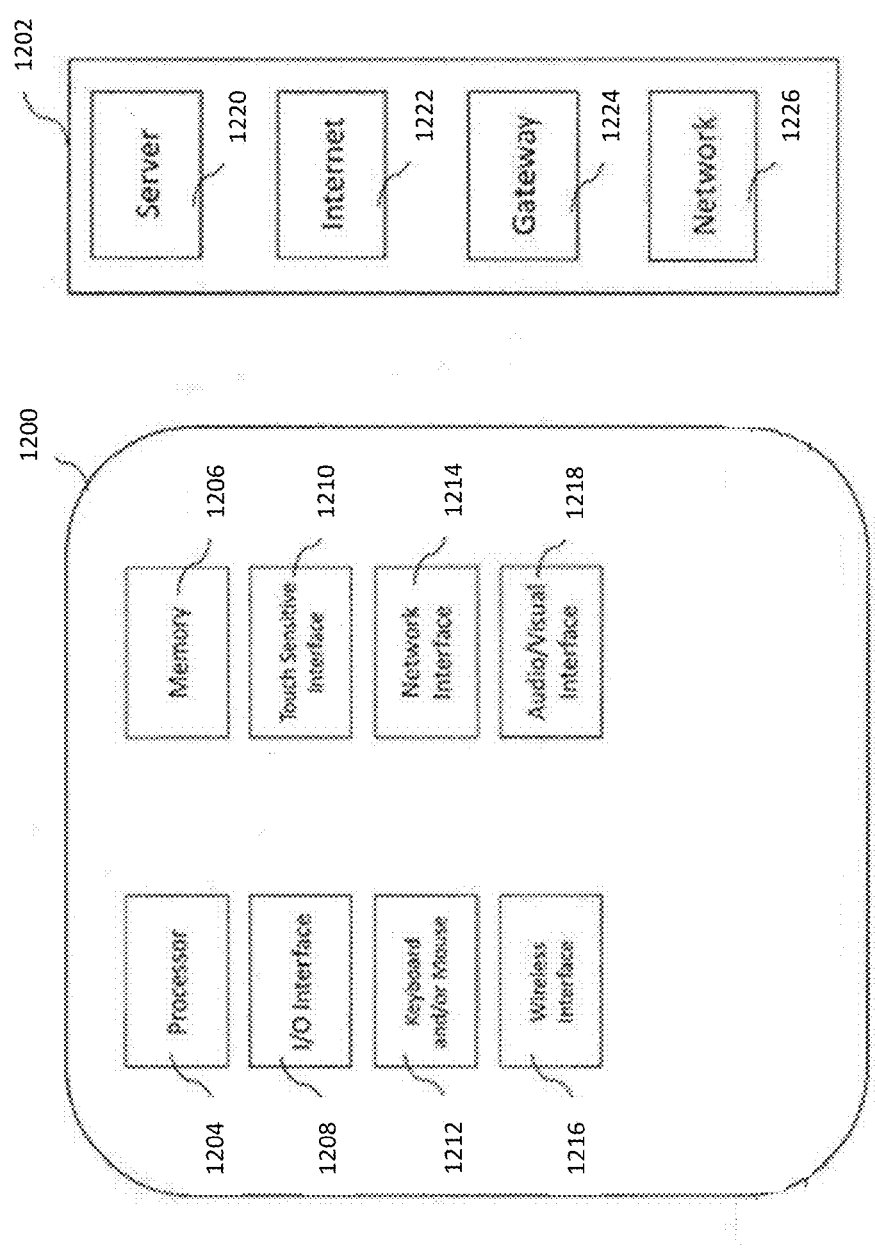
FIG. 12 is a computer device and operating environment according to one or more examples described in this document.

FIG. 12 is a computer device 1200 that illustrates one possible hardware configuration and operating environment 1202 to support the systems and methods described above, including systems 200, 800, 900, 1000, and 1100 and method 600 above. In order to provide additional context for various examples of the systems and methods in this document, the following discussion is intended to provide a brief, general description of a suitable computing environment in which the various examples of the systems and methods in this document can be implemented. Those skilled in the art will recognize that the systems and methods in this document also can be implemented in combination with other program modules and/or as a combination of hardware and software. Generally, program modules include routines, programs, components, data structures, etc., that perform particular tasks or implement particular abstract data types.

In the illustrated example, computer device 1200 can include one or more software and/or hardware components, including processor 1204, memory 1206, input-output (I/O) interface 1208, optional touch sensitive interface 1210, keyboard and/or mouse 1212, network interface 1214, wireless interface 1216, and audio and/or visual interface 1218. In another example, the computer device can include more or fewer components than shown or have a different configuration of components. For example, the computer device can have two or more of each of these components, for example, two or more processors, memory, I/O interfaces, and/or user interface modules. The components illustrated in FIG. 12 can be implemented in hardware, software or a combination of both hardware and software. In the illustrated example, operating environment 1202 can include gateway 1224, server 1220, network 1226, and/or internet 1222. Operating environment can include any type and/or number of networks, including wired or wireless internet, cellular network, satellite network, local area network, wide area network, public telephone network, and/or the like. In the illustrated example, computer device 1200 can communicate with operating environment 1202 through server 1220 by a wireless network connection and/or a wired network connection. Further, server 1220 can connect computer device 1200 to the public telephone network to enable telephone functionality (voice and data) of the computer device 1200.

Moreover, those skilled in the art will appreciate that the inventive methods can be practiced with other computer system configurations, including single-processor or multi-processor computer systems, minicomputers, mainframe computers, as well as personal computers, hand-held computing devices, microprocessor-based or programmable consumer electronics, and the like, each of which can be operatively coupled to one or more associated devices. The illustrated examples of the systems and methods in this document can also be practiced in distributed computing environments where certain tasks can be performed by remote processing devices that can be linked through a communications network. In a distributed computing environment, program modules can be located in both local and remote memory storage devices.

The computer device 1200 can utilize an exemplary environment for implementing various examples of the systems and methods in this document including a computer, wherein the computer can include a processing unit, a system memory and a system bus. The system bus couples system components including, but not limited to the system memory to the processing unit. The processing unit can be any of various commercially available processors. Dual microprocessors and other multi-processor architectures also can be employed as the processing unit.

The system bus can be any of several types of bus structure including a memory bus or memory controller, a peripheral bus and a local bus using any of a variety of commercially available bus architectures. The system memory can include read only memory (ROM) and random access memory (RAM). A basic input/output system (BIOS), containing the basic routines that help to transfer information between elements within the computer device 1200, such as during start-up, is stored in the ROM.

The computer device 1200 can further include a hard disk drive, a magnetic disk drive, for example, to read from or write to a removable disk, and an optical disk drive, for example, for reading a CD-ROM disk or to read from or write to other optical media. The computer device 1200 can include at least some form of computer readable media. Computer readable media can be any available media that can be accessed by the computer. By way of example, and not limitation, computer readable media can comprise computer storage media and communication media. Computer storage media can include volatile and nonvolatile, removable and non-removable media implemented in any method or technology for storage of information such as computer readable instructions, data structures, program modules or other data. Computer storage media can include, but is not limited to, RAM, ROM, EEPROM, flash memory or other memory technology, CD-ROM, digital versatile disks (DVD) or other magnetic storage devices, or any other medium which can be used to store the desired information and which can be accessed by the computer device 1200.

Communication media typically embodies computer readable instructions, data structures, program modules or other data in a modulated data signal such as a carrier wave or other transport mechanism and can include any information delivery media. The term "modulated data signal" means a signal that has one or more of its characteristics set or changed in such a manner as to encode information in the signal. By way of example, and not limitation, communication media can include wired media such as a wired network or direct-wired connection, and wireless media such as acoustic, RF, infrared and other wireless media. Combinations of any of the above should also be included within the scope of computer readable media.

A number of program modules can be stored in the drives and RAM, including an operating system, one or more application programs, other program modules, and program data. The operating system in the computer device 1200 can be any of a number of commercially available operating systems.

In addition, a user can enter commands and information into the computer or computer device through a keyboard and a pointing device, such as a mouse. Other input devices can include a microphone, an IR remote control, a track ball, a pen input device, a joystick, a game pad, a digitizing tablet, a satellite dish, a scanner, or the like. These and other input devices are often connected to the processing unit through a serial port interface that is coupled to the system bus, but can be connected by other interfaces, such as a parallel port, a game port, a universal serial bus ("USB"), an IR interface, and/or various wireless technologies. A monitor or other type of display device, can also be connected to the system bus using an interface, such as a video adapter. Visual output can also be accomplished through a remote display network protocol such as Remote Desktop Protocol, VNC, X-Window System, etc. In addition to visual output, a computer typically can include other peripheral output devices, such as speakers, printers, etc.

A display can be employed with the computer device 1200 to present data that is electronically received from the processing unit. For example, the display can be an LCD, plasma, CRT, etc. monitor that presents data electronically. Alternatively or in addition, the display can present received data in a hard copy format such as a printer, facsimile, plotter etc. The display can present data in any color and can receive data from the computer device 1200 using any wireless or hard wire protocol and/or standard.

The computer can operate in a networked environment using logical and/or physical connections to one or more remote computers, such as a remote computer(s). The remote computer(s) can be a workstation, a server computer, a router, a personal computer, microprocessor based entertainment appliance, a peer device or other common network node, and typically can include many or all of the elements described relative to the computer. The logical connections depicted include a local area network (LAN) and a wide area network (WAN). Such networking environments can be commonplace in offices, enterprise-wide computer networks, intranets and the Internet.

When used in a LAN networking environment, the computer is connected to the local network through a network interface or adapter. When used in a WAN networking environment, the computer typically can include a modem, or is connected to a communications server on the LAN, or has other means for establishing communications over the WAN, such as the Internet. In a networked environment, program modules depicted relative to the computer, or portions thereof, can be stored in the remote memory storage device. It will be appreciated that network connections described in this document are exemplary and other means of establishing a communications link between the computers can be used.

While the systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on provided in this document. Additional advantages and modifications will readily appear to those skilled in the art. Therefore, the systems and methods in this document, in its broader examples, is not limited to the specific details, the representative system or method, and illustrative examples shown and described. Accordingly, departures can be made from such details without departing from the spirit or scope of the applicant's general inventive concept. Thus, this application is intended to embrace alterations, modifications, and variations that fall within the scope of the appended claims. Furthermore, the preceding description is not meant to limit the scope of the systems and methods in this document. Rather, the scope of the systems and methods in this document is to be determined by the appended claims and their equivalents.

The examples of the systems and methods shown in the drawings and described above are exemplary of numerous examples that can be made within the scope of the appended claims. It is understood that numerous other configurations of the method and system can be created taking advantage of the disclosed approach. Description of information in terms of user interfaces is for convenience. It will be readily apparent to a person of ordinary skill in the art to organize, arrange, and display other iterations of the examples in a similar manner. In short, it is the applicant's intention that the scope of the patent issuing herefrom will be limited only by the scope of the appended-claims.

What is claimed is:

1. A method comprising: creating, using a visual programming language, a topological framework model configured to both spatially arrange a set of one or more agent submodels and incorporate an environmental submodel of a real-world environment for each position of the topological framework model; creating, using the visual programming language, a set of one or more agent submodels, each of which includes executable software to cause the agent submodel to mimic behavior of a previously identified animate real world object; creating, using the visual programming language, a set of environmental submodels of one or more real-world environments, each of which is configured to simulate a real-world environment associated with an identified position of the topological framework model; populating, using the visual programming language, each position of the topological framework model with a member of the set of environmental submodels; populating, using the visual programming language, the topological framework model with each member of the set of agent submodels; capturing the topological framework model by converting elements of the visual programming language to a textual programming language to create an execution script; beginning execution of the topological framework model according to the execution script; tracking incremental steps of execution of each member of the set of agent submodels according to a clock configured to synchronize execution of each member of the set of agent submodels; and displaying, in a graphical user interface, a visual representation of the topological framework model associated with a specific clock tick; wherein an environmental submodel at the identified position of the topological framework model is configured to influence behavior of an agent submodel at the identified position of the topological framework model by either constraining or enabling a behavior of the agent submodel at the identified position of the topological framework model, the agent sub-model is configured to alter a parameter of the environmental submodel at the identified position of the topological framework model, and the set of agent submodels is further disposed in an agent vector that is not spatially organized and that is configured to facilitate communication among the one or more agent sub-models.

2. The method of claim 1, further comprising a step of revealing, on the visual representation of the topological framework model, intermediate computations of any of the topological model, environmental submodel, or agent submodel.

3. The method of claim 1, further comprising a step of connecting a graphical code chip to a graphical input pin.

4. The method of claim 1, further comprising a step of including a container in the topological framework model.

5. The method of claim 1, wherein one environmental submodel of the set of environmental submodels incorporates a stock component.

6. The method of claim 1, wherein one environmental submodel of the set of environmental submodels incorporates a flow component.

7. The method of claim 1, further comprising a step of creating an additional aggregator.

8. The method of claim 1, wherein the topological framework model is a simulated world.

9. The method of claim 8, wherein the simulated world includes a unique label for each agent submodel.

10. The method of claim 8, wherein the simulated world maintains the dimensional location within the simulated world for each agent submodel.

11. The method of claim 8, wherein the simulated world maintains a record of how long each agent submodel has existed.

12. The method of claim 8, wherein the simulated world can create a new agent submodel.

13. The method of claim 8, wherein the simulated world can delete an existing agent submodel.

14. The method of claim 1, wherein a graphical code chip encapsulates an instance of a submodel.

15. The method of claim 7, wherein the aggregator is an agent vector that includes a series of independently operating agent submodels.

16. The method of claim 15, wherein the agent vector is combined with the topological framework model.

17. The method of claim 7, wherein the aggregator is a cell matrix that includes a multidimensional array of cells, each cell of which is populated by an environmental submodel.

* * * * *